United States Patent
Takamuku

(10) Patent No.: US 7,408,385 B2
(45) Date of Patent: Aug. 5, 2008

(54) RECEIVER CIRCUIT, DIFFERENTIAL SIGNAL RECEIVER CIRCUIT, INTERFACE CIRCUIT, AND ELECTRONIC INSTRUMENT

(75) Inventor: Makoto Takamuku, Sapporo (JP)

(73) Assignee: Seiko Epson Corporation, Tokyo (JP)

( * ) Notice: Subject to any disclaimer, the term of this patent is extended or adjusted under 35 U.S.C. 154(b) by 15 days.

(21) Appl. No.: 11/414,265

(22) Filed: May 1, 2006

(65) Prior Publication Data

US 2006/0245508 A1    Nov. 2, 2006

(30) Foreign Application Priority Data

May 2, 2005  (JP)  ............... 2005-134009
Mar. 8, 2006  (JP)  ............... 2006-062874

(51) Int. Cl.
*H03K 19/0175*  (2006.01)
*H04B 1/00*  (2006.01)

(52) U.S. Cl. ............... 326/82; 326/86; 326/115; 327/109; 375/146; 375/147

(58) Field of Classification Search ............. 326/82–83, 326/86, 115; 375/146–147; 327/108–109
See application file for complete search history.

(56) References Cited

U.S. PATENT DOCUMENTS

| | | | |
|---|---|---|---|
| 4,968,905 A | | 11/1990 | Sanwo et al. |
| 5,504,782 A | * | 4/1996 | Campbell, Jr. ............... 375/259 |
| 5,512,853 A | | 4/1996 | Ueno et al. |
| 6,448,815 B1 | * | 9/2002 | Talbot et al. ............... 326/86 |
| 6,586,995 B1 | | 7/2003 | Tachibana |
| 6,631,159 B1 | * | 10/2003 | Morris ............... 375/219 |
| 6,690,196 B1 | * | 2/2004 | Cecchi et al. ............... 326/82 |
| 7,248,635 B1 | * | 7/2007 | Arneson et al. ............... 375/257 |
| 2004/0085097 A1 | * | 5/2004 | Ta et al. ............... 327/65 |
| 2005/0066077 A1 | | 3/2005 | Shibata et al. |

FOREIGN PATENT DOCUMENTS

| | | |
|---|---|---|
| JP | A 58-80564 | 5/1983 |
| JP | A 5-143181 | 6/1993 |
| JP | A 5-191167 | 7/1993 |
| JP | A 5-191168 | 7/1993 |
| JP | A 2005-236929 | 9/2005 |

* cited by examiner

*Primary Examiner*—Rexford Barnie
*Assistant Examiner*—Jason M Crawford
(74) *Attorney, Agent, or Firm*—Oliff & Berridge, PLC

(57) ABSTRACT

A receiver circuit, which is connected with a partner transmitter circuit through a signal line and receives a signal based on current which flows through the signal line, includes a current/voltage conversion circuit which converts the current which flows through the signal line into voltage, a power supply circuit which adjusts the current which flows through the signal line based on a bias voltage Vb and voltage of a node NDX connected with the signal line, and a bias voltage generation circuit which outputs the bias voltage Vb which is adjusted in connection with characteristics of the power supply circuit.

13 Claims, 14 Drawing Sheets

RECEIVER CIRCUIT, DIFFERENTIAL SIGNAL RECEIVER CIRCUIT, INTERFACE CIRCUIT, AND ELECTRONIC INSTRUMENT

Japanese Patent Application No. 2005-134009 filed on May 2, 2005 and Japanese Patent Application No. 2006-62874 filed on Mar. 8, 2006, are hereby incorporated by reference in their entirety.

BACKGROUND OF THE INVENTION

The present invention relates to a receiver circuit, a differential signal receiver circuit, an interface circuit, and an electronic instrument.

In recent years, a high-speed serial transfer interface such as low voltage differential signaling (LVDS) has attracted attention as an interface aiming at reducing electromagnetic interference (EMI) noise or the like. In such a high-speed serial transfer interface, data is transferred by causing a transmitter circuit to transmit serialized data using differential signals and causing a receiver circuit to differentially amplify the differential signals.

The receiver circuit includes a differential amplifier circuit for amplifying each signal making up the differential signals. A signal which minutely changes is detected by amplifying the differential voltage between the voltage of each signal and a bias voltage.

In a known differential amplifier circuit of the receiver circuit, when the potential of the transmission line has been determined, the bias voltage is uniquely determined corresponding to the determined potential. Therefore, a voltage generated by a constant voltage generation circuit is provided as the bias voltage in order to provide a stable bias voltage to the receiver circuit. The configuration of such a constant voltage generation circuit is disclosed in JP-A-5-143181, JP-A-5-191167, and JP-A-5-191168, for example.

However, in order to secure the power supply voltage range of the differential amplifier circuit, the bias voltage is set at a high value taking into consideration the manufacturing variation of the constituent element of the differential amplifier circuit. Specifically, the current drive capability of a metal oxide semiconductor (hereinafter abbreviated as "MOS") transistor of the differential amplifier circuit is increased by increasing the bias voltage. This makes it difficult to operate the differential amplifier circuit at a lower voltage, whereby a higher speed data transfer which requires a low-amplitude signal transmission may not be realized.

As described above, even if a stable constant voltage is supplied as the bias voltage of the differential amplifier circuit which amplifies the received signal, a problem relating to the operation margin of the differential amplifier circuit necessarily occurs when pursuing a high-speed signal transmission. Therefore, it is important to reduce the operation margin of the differential amplifier circuit in order to realize a high-speed signal transmission.

The above problem is common to a high-speed signal transmission using differential signals and a high-speed signal transmission using a single-ended signal.

SUMMARY

A first aspect of the invention relates to a receiver circuit which is connected with a partner transmitter circuit through a signal line and receives a signal based on a current which flows through the signal line, the receiver circuit comprising:

a current/voltage conversion circuit which converts the current which flows through the signal line into a voltage;

a power supply circuit which adjusts the current which flows through the signal line based on a bias voltage and a voltage of a node connected with the signal line; and a bias voltage generation circuit which outputs the bias voltage which is adjusted in connection with characteristics of the power supply circuit.

A second aspect of the invention relates to a differential signal receiver circuit comprising:

a first receiver circuit connected with a first signal line making up a differential signal line which is current-driven by a transmitter circuit;

a second receiver circuit connected with a second signal line making up the differential signal line; and a comparator which outputs an output signal based on outputs from the first and second receiver circuits;

at least one of the first and second receiver circuits being the above receiver circuit.

A third aspect of the invention relates to an interface circuit comprising:

the above receiver circuit which is connected through a reception signal line with a transmitter circuit of a partner device which current-drives the reception signal line; and a transmitter circuit which is connected with a receiver circuit of the partner device through a transmission signal line and current-drives the transmission signal line.

A fourth aspect of the invention relates to an interface circuit comprising:

the above differential signal receiver circuit which is connected through a first signal line making up a differential signal line with a differential signal transmitter circuit of a partner device which current-drives the first signal line; and a differential signal transmitter circuit which is connected with a differential signal receiver circuit of the partner device through a second signal line making up the differential signal line and current-drives the second signal line.

A fifth aspect of the invention relates to an electronic instrument comprising:

the above interface circuit; and at least one of a communication device, a processor, an imaging device, and a display device.

DETAILED DESCRIPTION OF THE EMBODIMENT

Figure 1:
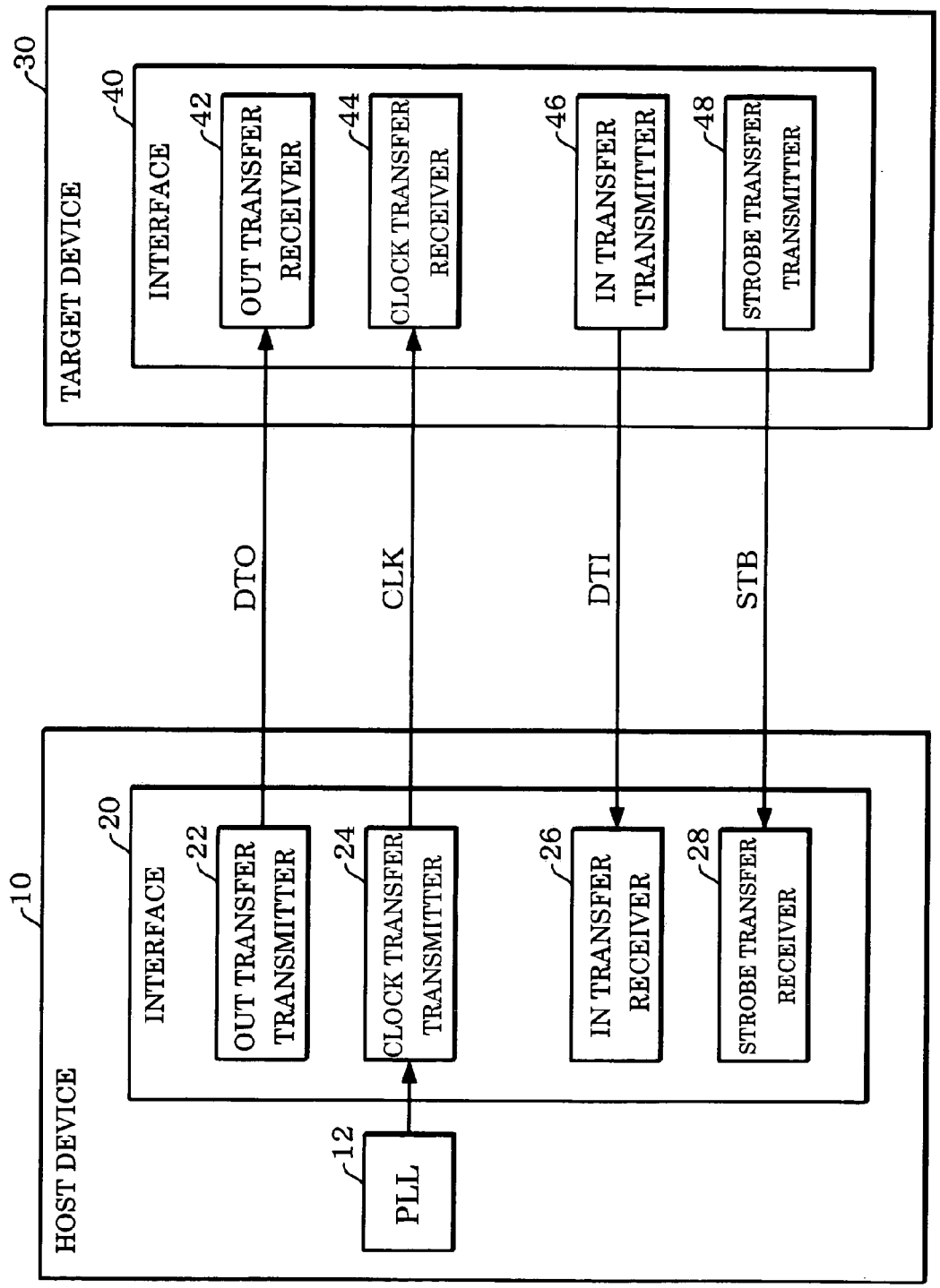
FIG. 1 is a diagram showing an outline of a configuration of a single-ended signal interface circuit according to one embodiment of the invention.

The invention may provide a receiver circuit and a differential signal receiver circuit which can be operated at a low voltage and receive a signal at high speed, an interface circuit, and an electronic instrument.

One embodiment of the invention relates to a receiver circuit which is connected with a partner transmitter circuit through a signal line and receives a signal based on a current which flows through the signal line, the receiver circuit comprising:

a current/voltage conversion circuit which converts the current which flows through the signal line into a voltage;

a power supply circuit which adjusts the current which flows through the signal line based on a bias voltage and a voltage of a node connected with the signal line; and a bias voltage generation circuit which outputs the bias voltage which is adjusted in connection with characteristics of the power supply circuit.

According to this embodiment, the current which flows through the signal line is not adjusted based on the bias voltage of which the potential is fixed and the voltage of the signal line. Therefore, when the characteristics of the constituent element of the power supply circuit (e.g. current drive capability of transistor) have changed from the designed characteristics due to process variation during the manufacture or the like, the bias voltage generation circuit can generate the bias voltage of which the potential is adjusted. In this case, the potential of the signal line also changes. However, since the power supply circuit can adjust the current which flows through the signal line by detecting a signal on the signal line at a lower potential, even if the characteristics of the constituent element of the power supply circuit have changed, the power supply circuit can be operated without providing a large margin potential by supplying the bias voltage corresponding to the change. This allows a signal on the signal line at a lower potential to be detected while maintaining the high-speed operability of the power supply circuit.

In the receiver circuit according to this embodiment, the power supply circuit may include: a first current adjustment transistor connected with the node and the current/voltage conversion circuit; and first and second differential transistors which make up a differential pair and of which a drain current is controlled; wherein a gate of the first differential transistor is connected with the node, and a drain of the first differential transistor is connected with a gate of the first current adjustment transistor; the bias voltage may be supplied to a gate of the second differential transistor; and the bias voltage generation circuit may generate the bias voltage corresponding to the drain current of the first or second differential transistor.

According to this embodiment, since the signal line and the output node to which the output voltage is output can be separated, the capacitance of the signal line driven by the transmitter circuit can be reduced. Therefore, the capacitance to be driven by the transmitter circuit can be reduced. Moreover, the amplitude of a signal transmitted through the signal line can be reduced, whereby a change in the signal can be detected at high speed.

In the receiver circuit according to this embodiment, the bias voltage generation circuit may include a bias voltage generation transistor of the same conductivity type as that of the second differential transistor; and a gate and a drain of the bias voltage generation transistor may be connected with the gate of the second differential transistor.

In the receiver circuit according to this embodiment, the bias voltage generation transistor is formed on the same substrate as the first and second differential transistors; and a drain current of the bias voltage generation transistor may be adjusted corresponding to the drain currents of the first and second differential transistors.

In the receiver circuit according to this embodiment, the power supply circuit may include a second current adjustment transistor which adjusts sum of the drain currents of the first and second differential transistors; the bias voltage generation circuit may include a third current adjustment transistor for generating a current proportional to a drain current of the bias voltage generation transistor; and a voltage equal to a gate voltage of the second current adjustment transistor may be supplied to a gate of the third current adjustment transistor.

In the receiver circuit according to this embodiment, the bias voltage generation circuit may include: a bias voltage generation transistor of the same conductivity type as that of the second differential transistor; and a current adjustment transistor which adjusts a drain current of the bias generation transistor.

According to the above embodiment, a change in the current drive capabilities of the first and second differential transistors of the power supply circuit due to manufacturing variation can be allowed to correspond to a change in the current drive capabilities of the transistors of the voltage generation circuit due to manufacturing variation. Therefore, the potential of the bias voltage can be more accurately adjusted. This make it possible to omit a margin potential for the bias voltage or provide a reduced margin potential.

Another embodiment of the invention relates to a differential signal receiver circuit comprising:

a first receiver circuit connected with a first signal line making up a differential signal line which is current-driven by a transmitter circuit;

a second receiver circuit connected with a second signal line making up the differential signal line; and a comparator which outputs an output signal based on outputs from the first and second receiver circuits;

at least one of the first and second receiver circuits being the above receiver circuit.

In the differential signal receiver circuit according to this embodiment, the first and second receiver circuits may be the above receiver circuits; and the comparator may compare a voltage converted by the current/voltage conversion circuit of the first receiver circuit with a voltage converted by the current/voltage conversion circuit of the second receiver circuit to output the output signal.

According to the above embodiment, a differential signal receiver circuit which can be operated at a low voltage and receive differential signals at high speed can be provided.

Another embodiment of the invention relates to an interface circuit comprising:

the above receiver circuit which is connected through a reception signal line with a transmitter circuit of a partner device which current-drives the reception signal line; and a transmitter circuit which is connected with a receiver circuit of the partner device through a transmission signal line and current-drives the transmission signal line.

According to this embodiment, an interface circuit can be provided which includes a differential signal receiver circuit which can be operated at a low voltage and transmit and receive differential signals at high speed.

Another embodiment of the invention relates to an interface circuit comprising:

the above differential signal receiver circuit which is connected through a first signal line making up a differential signal line with a differential signal transmitter circuit of a partner device which current-drives the first signal line; and a differential signal transmitter circuit which is connected with a differential signal receiver circuit of the partner device through a second signal line making up the differential signal line and current-drives the second signal line.

A further embodiment of the invention relates to an electronic instrument comprising:

the above interface circuit; and at least one of a communication device, a processor, an imaging device, and a display device.

According to the above embodiment, an electronic instrument can be provided which includes an interface circuit which can be operated at a low voltage and transmit and receive differential signals at high speed.

The embodiments of the invention are described below in detail with reference to the drawings. Note that the embodiments given below do not in any way limit the scope of the invention laid out in the claims. Note that all elements of the embodiments given below should not necessarily be taken as essential requirements for the invention.

A receiver circuit described in the embodiments given below may be applied to a single-ended signal receiver circuit and a differential signal receiver circuit.

1. Single-ended Signal Interface Circuit 1.1 Interface Circuit

FIG. 1 shows an outline of a configuration of a single-ended signal interface circuit according to one embodiment of the invention. In this embodiment, a host device 10 supplies a clock signal, and a target device 30 operates using the supplied clock signal as a system clock signal.

In FIG. 1, DTO indicates data (OUT data) output from the host device 10 (device in a broad sense) to the target device 30 (device in a broad sense). CLK indicates a clock signal supplied from the host device 10 to the target device 30. The host device 10 outputs the data DTO in synchronization with the edge (rising edge or falling edge) of the clock signal CLK. Therefore, the target device 30 can sample and capture the data DTO using the clock signal CLK. In FIG. 1, the target device 30 operates based on the clock signal CLK supplied from the host device 10. Specifically, the clock signal CLK serves as the system clock signal of the target device 30. Therefore, a phase locked loop (PLL) circuit 12 (clock signal generation circuit in a broad sense) is provided in the host device 10, and is not provided in the target device 30.

DTI indicates data (IN data) output from the target device 30 to the host device 10. STB indicates a strobe (clock signal in a broad sense) supplied from the target device 30 to the host device 10. The target device 30 generates and outputs the strobe STB based on the clock signal CLK supplied from the host device 10. The target device 30 outputs the data DTI in synchronization with the edge (rising edge or falling edge) of the strobe STB. Therefore, the host device 10 can sample and capture the data DTI using the strobe STB.

The data DTO, the clock signal CLK, the data DTI, and the strobe STB are transmitted by causing transmitter circuits (driver circuits) to current-drive the corresponding signal lines (serial signal lines in a broad sense).

An interface circuit 20 of the host device 10 includes OUT transfer (data transfer in a broad sense) and clock transfer transmitter circuits 22 and 24, and IN transfer (data transfer in a broad sense) and strobe transfer (clock transfer in a broad sense) receiver circuits 26 and 28. An interface circuit 40 of the target device 30 includes OUT transfer and clock transfer receiver circuits 42 and 44, and IN transfer and strobe transfer transmitter circuits 46 and 48. Note that some of these circuit blocks may be omitted.

The OUT transfer and clock transfer transmitter circuits 22 and 24 respectively transmit the data DTO and the clock signal CLK by current-driving the DTO and CLK signal lines. The OUT transfer and clock transfer receiver circuits 42 and 44 respectively detect and receive the data DTO and the clock signal CLK by performing a current/voltage conversion based on the current flowing through the DTO and CLK signal lines, and comparing (differential amplification) the voltage obtained by current/voltage conversion with a bias voltage.

The IN transfer and strobe transfer transmitter circuits 46 and 48 respectively transmit the data DTI and the strobe STB by current-driving the DTI and STB signal lines. The IN transfer and strobe transfer receiver circuits 26 and 28 respectively detect and receive the data DTI and the strobe STB by performing a current/voltage conversion based on the current flowing through the DTI and STB signal lines, and comparing (differential amplification) the voltage obtained by current/voltage conversion with a bias voltage.

As described above, the interface circuit may include a receiver circuit which is connected through a reception signal line with a transmitter circuit of a partner device which current-drives the reception signal line, and a transmitter circuit which is connected with a receiver circuit of the partner device through a transmission signal line and current-drives the transmission signal line. The interface circuits 20 and 40 shown in FIG. 1 respectively include two transmitter circuits and two receiver circuits.

1.2. Receiver Circuit

Figure 2:
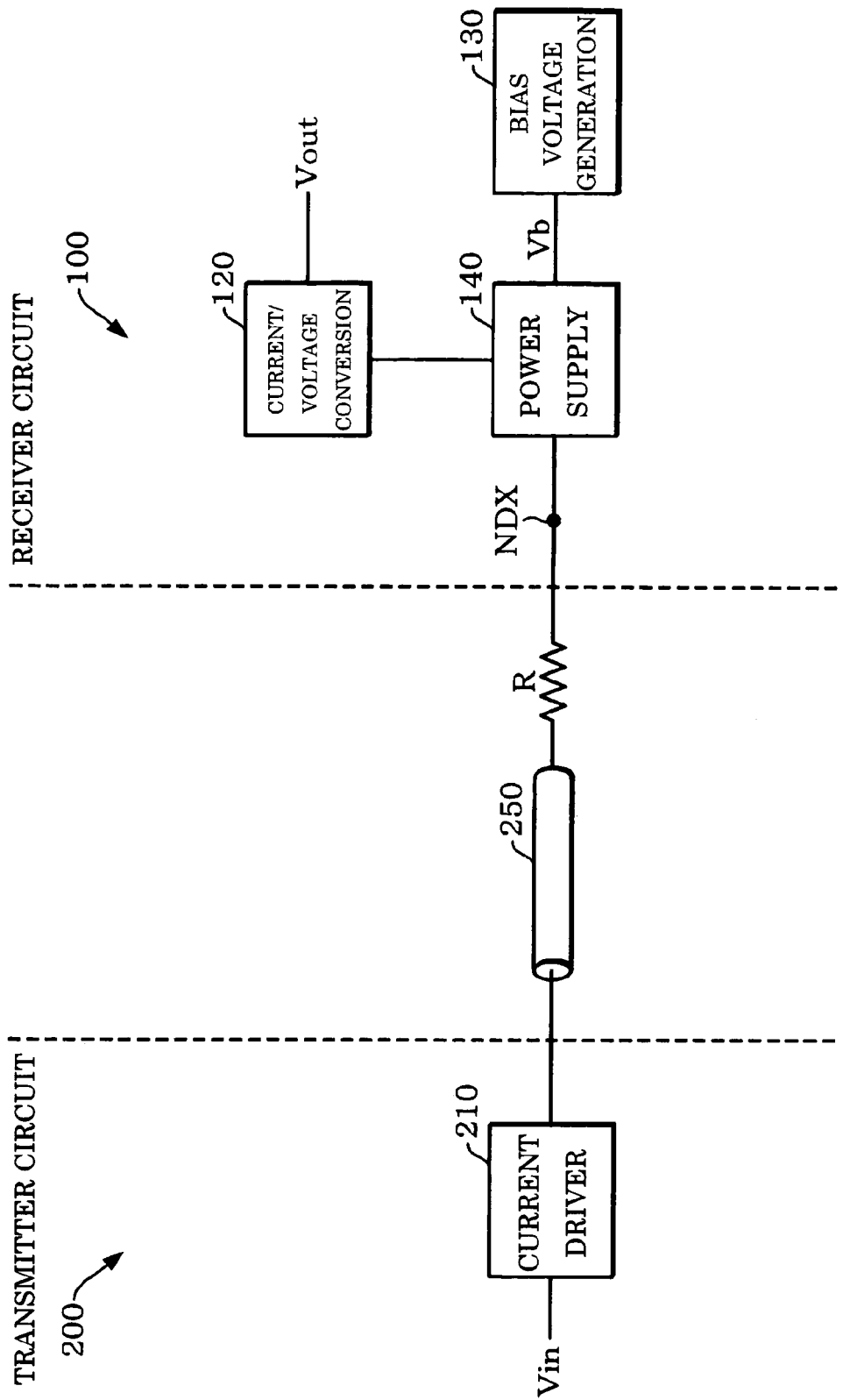
FIG. 2 is a diagram showing an outline of a configuration of a receiver circuit according to one embodiment of the invention.

FIG. 2 shows an outline of a configuration of the receiver circuit according to this embodiment. The receiver circuit shown in FIG. 2 may be used as the IN transfer receiver circuit 26, the strobe transfer receiver circuit 28, the OUT transfer receiver circuit 42, and the clock transfer receiver circuit 44 shown in FIG. 1.

A transmitter circuit 200 is connected with a receiver circuit 100 through a signal line 250 which is a transmission line. The transmitter circuit 200 includes a current driver circuit 210. The current driver circuit 210 current-drives the signal line 250 based on an input voltage Vin corresponding to transmission data. A single-ended signal is transmitted through the signal line 250 by the transmitter circuit 200. The transmitter circuit 200 may be used as the OUT transfer transmitter circuit 22, the clock transfer transmitter circuit 24, the IN transfer transmitter circuit 46, and the strobe transfer transmitter circuit 48 shown in FIG. 1.

The receiver circuit 100 is connected with the signal line 250 which is current-driven by the transmitter circuit 200. The receiver circuit 100 includes a power supply circuit 140, a current/voltage conversion circuit 120, and a bias voltage generation circuit 130. The power supply circuit 140 may include a differential amplifier circuit 110. In this case, the differential amplifier circuit 110 amplifies the differential voltage between the voltage of the signal line 250 and a bias voltage Vb. In order to prevent reflection of the signal transmitted through the signal line 250, the power supply circuit 140 of the receiver circuit 100 is connected with the signal line 250 through an impedance matching resistor R having the same impedance as the characteristic impedance of the signal line 250. The impedance matching resistor R is provided outside the receiver circuit 100, for example.

The power supply circuit 140 adjusts the current flowing through the signal line 250 based on the bias voltage Vb from the bias voltage generation circuit 130 and the voltage of a node NDX connected with the signal line 250. In more detail, the power supply circuit 140 adjusts the current flowing through the signal line 250 corresponding to the difference between the voltage of the node NDX and the bias voltage Vb.

The current/voltage conversion circuit 120 is driven by the current driver circuit 210 of the transmitter circuit 200, and converts the current flowing through the signal line 250 into a voltage. The output from the current/voltage conversion circuit 120 is an output voltage Vout corresponding to the reception result.

The bias voltage generation circuit 130 generates the bias voltage Vb. In more detail, the bias voltage generation circuit 130 outputs the bias voltage Vb which is adjusted in connection with the characteristics of the power supply circuit 140 (characteristics (static characteristics) of a MOS transistor which is a constituent element of the power supply circuit 140 (e.g. differential amplifier circuit)). In other words, the bias voltage generation circuit 130 generates the bias voltage of which the potential can be adjusted.

This embodiment thus eliminates an unnecessary current adjustment based on the bias voltage of which the potential is fixed and the voltage of the signal line 250. Therefore, when the current drive capability of the MOS transistor of the power supply circuit 140 has changed from the designed current drive capability due to process variation during the manufacture or the like, the bias voltage generation circuit 130 can generate the bias voltage Vb of which the potential is adjusted, for example. In this case, although the transmission line potential of the signal line 250 also changes, the power supply circuit 140 can detect the signal at a lower transmission line potential. When the channel width and the channel length of the transistor are respectively indicated by W and L, the current drive capability of the transistor may be indicated by "W/L".

Figure 3A:
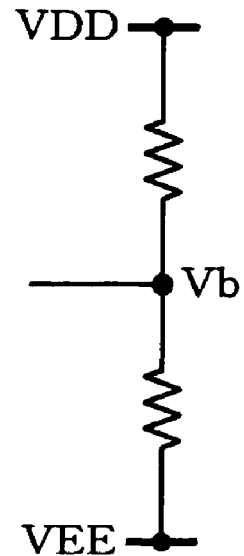
FIG. 3A is a diagram showing an example of a circuit which generates a bias voltage Vb as a comparative example.
Figure 3B:
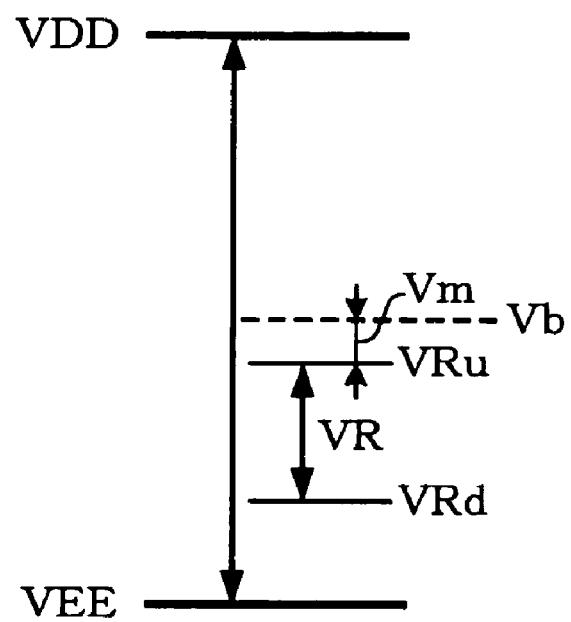
FIG. 3B is diagram illustrative of an operating power supply voltage of a receiver circuit.

FIGS. 3A and 3B are diagrams illustrative of the operating power supply voltage of the receiver circuit.

As shown in FIG. 3B, the operating power supply voltage of the receiver circuit 100 is a voltage between a high-potential-side power supply voltage VDD and a low-potential-side power supply voltage VEE. For example, a transmission line potential range VR which is the width of the transmission line potential of the signal line 250 is determined by the peak values of a signal which oscillates with respect to a given potential.

In order to detect a signal of which the potential changes within the transmission line potential range VR, the bias voltage Vb is supplied to the differential amplifier circuit taking into consideration the manufacturing variation of the constituent element of the differential amplifier circuit. FIG. 3A is a circuit diagram as a comparative example in which the bias voltage Vb is generated by dividing the voltage between the high-potential-side power supply voltage VDD and the low-potential-side power supply voltage VEE using two fixed circuits. When the transmission line potential range VR is specified by a high-potential-side boundary potential VRu and a low-potential-side boundary potential VRd, the bias voltage Vb is set at a voltage higher than the high-potential-side boundary potential VRu in an amount corresponding to a margin potential Vm.

This allows detection of a signal which changes within the specific transmission line potential range VR even if the current drive capability of the MOS transistor of the differential amplifier circuit is decreased due to manufacturing process variations or the like.

However, since the margin potential Vm is required within the operating power supply voltage, the margin between the high-potential-side power supply voltage VDD and the bias voltage Vb is decreased, whereby the differential amplifier circuit may not maintain the high-speed operation. A configuration may be employed in which the bias voltage Vb is made variable by changing a value set in a register or blowing a fuse, for example. However, this requires an additional setting process.

According to this embodiment, even if the current drive capability of the MOS transistor of the power supply circuit 140 has changed due to the manufacturing process or the like, the power supply circuit 140 can be operated without providing a large margin potential Vm by supplying the bias voltage Vb corresponding to the change in the current drive capability of the MOS transistor. Therefore, a signal at a lower potential within the transmission line potential range VR can be detected while maintaining the high-speed current adjustment of the power supply circuit 140.

The receiver circuit according to this embodiment may have various configurations.

1.3 FIRST CONFIGURATION EXAMPLE

Figure 4:
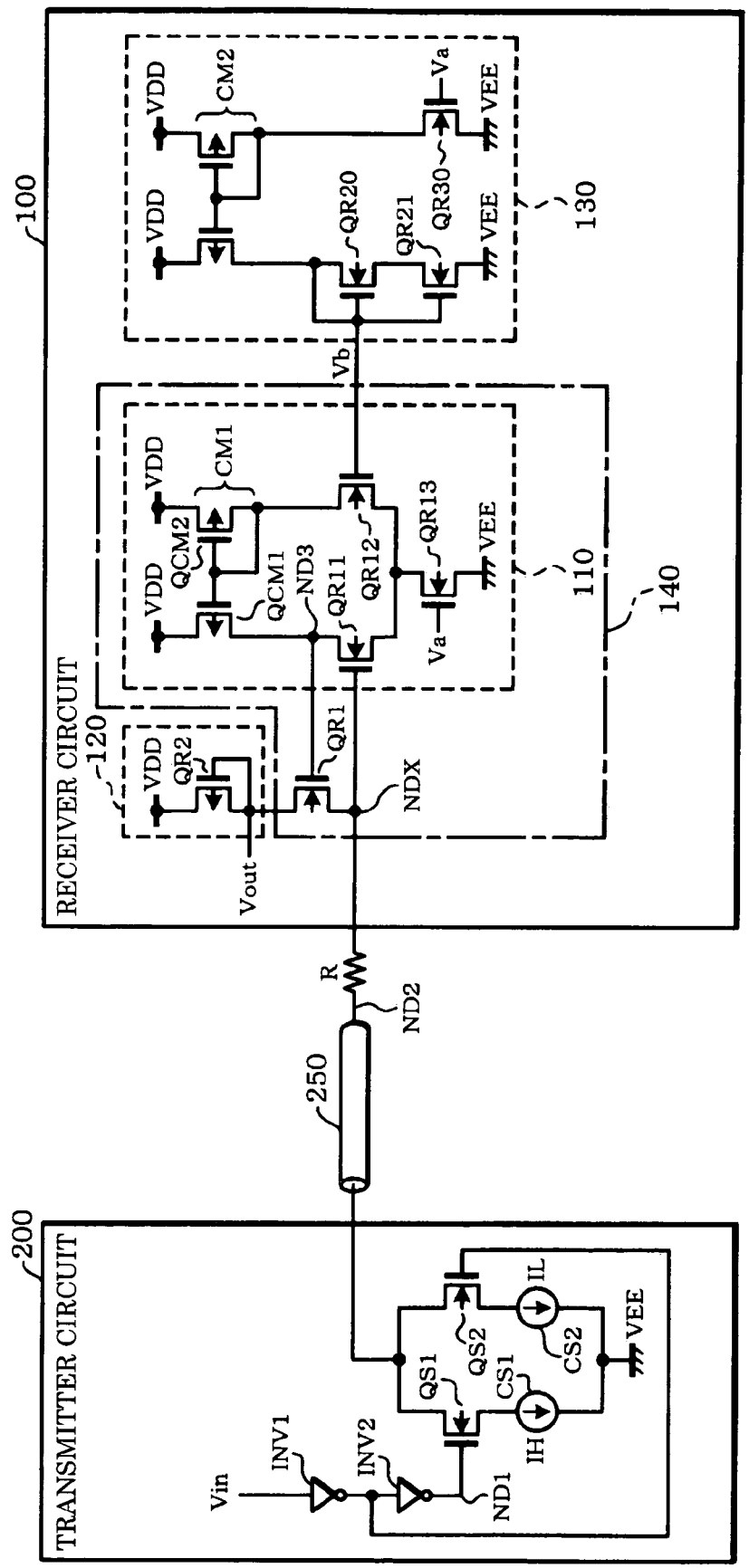
FIG. 4 is a circuit diagram of a first configuration example of the receiver circuit shown in FIG. 2.

FIG. 4 is a circuit diagram of a first configuration example of the receiver circuit shown in FIG. 2.

FIG. 4 also shows a circuit diagram of a configuration example of the transmitter circuit 200 shown in FIG. 2. In FIG. 4, the same sections as shown in FIG. 2 are indicated by the same symbols. Description of these sections is appropriately omitted.

The transmitter circuit 200 includes N-type (second conductivity type in a broad sense) MOS transistors (MOS transistor is hereinafter abbreviated as "transistor") QS1 and QS2. The drains of the transistors QS1 and QS2 are connected with the signal line 250. The input voltage Vin is buffered by inverters INV1 and INV2. The output voltage of the inverter INV2 is supplied to the gate of the transistor QS1. The output voltage of the inverter INV1 is supplied to the gate of the transistor QS2.

A current source CS1 for causing a current IH to flow is provided to the source of the transistor QS1. The current source CS1 may be formed by an N-type MOS transistor of which the drain is connected with the source of the transistor QS1, to which the low-potential-side power supply voltage VEE is supplied at the source, and to which a specific voltage is supplied at the gate.

A current source CS2 for causing a current IL smaller than the current IH to flow is provided to the source of the transistor QS2. The current source CS2 may be formed by an N-type MOS transistor of which the drain is connected with the source of the transistor QS2, to which the low-potential-side power supply voltage VEE is supplied at the source, and to which a specific voltage is supplied at the gate.

Therefore, the transistor QS1 is turned ON and the transistor QS2 is turned OFF when the input voltage Vin is set at a high-potential-side power supply voltage corresponding to the logic level "H", whereby the transmitter circuit 200 draws the current IH through the signal line 250 (current-drives the signal line 250). When the input voltage Vin is set at a low-potential-side power supply voltage corresponding to the logic level "L", the transistor QS1 is turned OFF and the transistor QS2 is turned ON, whereby the transmitter circuit 200 draws the current IL through the signal line 250 (current-drives the signal line 250).

The other end of the impedance matching resistor R which is connected with the signal line 250 at one end is connected with the power supply circuit 140 of the receiver circuit 100. In more detail, the other end of the impedance matching resistor R is connected with the differential amplifier circuit 110 of the power supply circuit 140.

The differential amplifier circuit 110 of the power supply circuit 140 includes N-type MOS transistors QR11 and QR12 (first and second differential transistors) making up a differential pair. The sources of the transistors QR11 and QR12 are connected, and the sum of the drain current of each transistor is a constant value. The transistor QR11 is gate-controlled based on the voltage of the signal line 250 (source voltage of a transistor QR1 or the voltage of the other end of the impedance matching resistor R in FIG. 4). The drain voltage of the transistor QR11 is output as the output voltage of the differential amplifier circuit 110, and the output voltage is supplied to the gate of the transistor QR1. The transistor QR12 is gate-controlled based on the bias voltage Vb.

The power supply circuit 140 further includes the N-type MOS transistor QR1 (first current adjustment transistor). The transistor QR1 is gate-controlled based on the output voltage of the differential amplifier circuit 110. Specifically, the output voltage of the differential amplifier circuit 110 is supplied to the gate of the transistor QR1, the signal line 250 (or, the other end of the impedance matching resistor R) is connected with the source of the transistor QR1, and the drain current of the transistor QR1 is controlled based on the output voltage. The voltage of the other end of the impedance matching resistor R is referred to as the voltage of the signal line 250.

Since the signal line 250 and the output node to which the output voltage Vout is output can be separated by providing the transistor QR1, the capacitance of the signal line 250 driven by the transmitter circuit 200 can be reduced. Therefore, the capacitance to be driven by the transmitter circuit 200 can be reduced. Moreover, the amplitude of a signal transmitted through the signal line 250 can be reduced, whereby a change in the signal can be detected at high speed.

The current/voltage conversion circuit 120 outputs the voltage corresponding to the drain current of the transistor QR1 as the output voltage Vout. The output voltage Vout is the drain voltage of the transistor QR1.

The current/voltage conversion circuit 120 may further include a P-type (first conductivity type in a broad sense) MOS transistor QR2 as a load element. The high-potential-side power supply voltage VDD is supplied to the source of the transistor QR2, and the gate and the drain of the transistor QR2 are connected with the drain of the transistor QR1. Therefore, the current/voltage conversion circuit 120 supplies the current generated based on the output voltage of the differential amplifier circuit 110 as the drain current of the transistor QR2 which is the load element to convert the current into a voltage corresponding to the current generated based on the output voltage of the differential amplifier circuit 110.

The bias voltage generation circuit 130 generates a voltage corresponding to the drain current of the transistor QR12 as the bias voltage Vb.

Specifically, the transistors QR11 and QR12 (first and second differential transistors) make up a differential pair in the receiver circuit 110, and each drain current is controlled. The gate of the transistor QR11 (first differential transistor) is connected with the node NDX, and the drain of the transistor QR11 is connected with the gate of the transistor QR1 (first current adjustment transistor). The bias voltage Vb is supplied to the gate of the transistor QR12 (second differential transistor). The transistor QR1 is connected with the node NDX and the current/voltage conversion circuit 120. The bias voltage generation circuit 130 generates the bias voltage Vb corresponding to the drain current of at least one of the transistors QR11 and QR12 (first and second differential transistors).

This allows the potential of the bias voltage Vb to be generated corresponding to the current drive capability of the transistor QR12, whereby the drain current of the transistor QR11 which makes up the differential pair also changes. As a result, the drain voltage of the transistor QR11 can be changed. Therefore, it is unnecessary to provide the margin potential Vm for the bias voltage Vb in order to operate the differential amplifier circuit 110 at high speed, or the margin potential Vm can be reduced.

The bias voltage generation circuit 130 may include a MOS transistor QR20 (first bias voltage generation transistor) of the same conductivity type (N-type) as that of the transistor QR12 (second differential transistor), the gate and the drain of the transistor QR20 being connected. The gate voltage of the transistor QR20 when causing a current corresponding to the drain current of the transistor QR11 or the transistor QR12 (first or second differential transistor) to flow as the drain current of the transistor QR20 is generated as the bias voltage Vb. Specifically, the transistor QR20 is formed on the same substrate as the transistors QR11 and QR12. The drain current of the transistor QR20 is adjusted corresponding to the drain current of at least one of the transistors QR11 and QR12.

This allows the manufacturing variation of the transistor QR12 to be equal to the manufacturing variation of the transistor QR20, whereby the change in the current drive capability of the transistor QR12 can be made equal to the change in the current drive capability of the transistor QR20. As a result, the potential of the bias voltage Vb is adjusted corresponding to the current drive capability of the transistor QR12.

In more detail, the differential amplifier circuit 110 may further include an N-type MOS transistor QR13 (second current adjustment transistor) which generates (adjusts) a current which is the sum of the drain currents of the transistors QR11 and QR12. A specific reference voltage Va is supplied to the gate of the transistor QR13. The bias voltage generation circuit 130 may further include an N-type MOS transistor QR21 (second bias voltage generation transistor) to which the gate voltage of the transistor QR20 (first bias voltage generation transistor) is supplied at the gate. The differential amplifier circuit 110 includes a current mirror circuit CM1. The current mirror circuit CM1 includes P-type MOS transistors QCM1 and QCM2. The gates of the transistors QCM1 and the QCM2 are connected. The drain of the transistor QCM1 is connected with the drain of the transistor QR11. The drain of the transistor QCM2 is connected with the gate of the transistor QCM2 and the drain of the transistor QR12.

When the sum of the current drive capabilities of the transistors QR11 and QR12 (first and second differential transistors) provided in parallel is indicated by DD, the current drive capability of the transistor QR13 (second current adjustment transistor) is indicated by ID, the current drive capability of the transistor QR20 (first bias voltage generation transistor) is indicated by BD1, and the current drive capability of the transistor QR21 (second bias voltage generation transistor) is indicated by BD2, it is preferable that "DD/ID" be equal to "BD1/BD2".

This allows the change in the current drive capability of the transistors QR11, QR12, and QR13 of the differential amplifier circuit 110 due to manufacturing variation to correspond to the change in the current drive capability of the transistors QR20 and QR21 of the bias voltage generation circuit 130 due to manufacturing variation. Therefore, the potential of the bias voltage Vb can be more accurately adjusted corresponding to the current drive capability of the transistor QR12.

In the bias voltage generation circuit 130, current generated by an N-type MOS transistor QR30 (third current adjustment transistor) to which the reference voltage Va is supplied at the gate is generated as the drain current of the transistors QR20 and QR21 using a current mirror circuit CM2. Specifically, the transistor QR30 generates a current proportional to the current generated by the transistor QR13 of the differential amplifier circuit 110. That is, the voltage equal to the gate voltage of the transistor RQ13 is supplied to the gate of the transistor QR30, and the transistor QR30 generates a current proportional to the drain current of the transistor QR20. It suffices that the drain current of the transistor QR20 (first bias voltage generation transistor) be C (C is a positive real number) times the drain current of the transistor QR30. In this case, the bias voltage Vb can be adjusted corresponding to the current drive capability of the transistor QR12.

Figure 5:
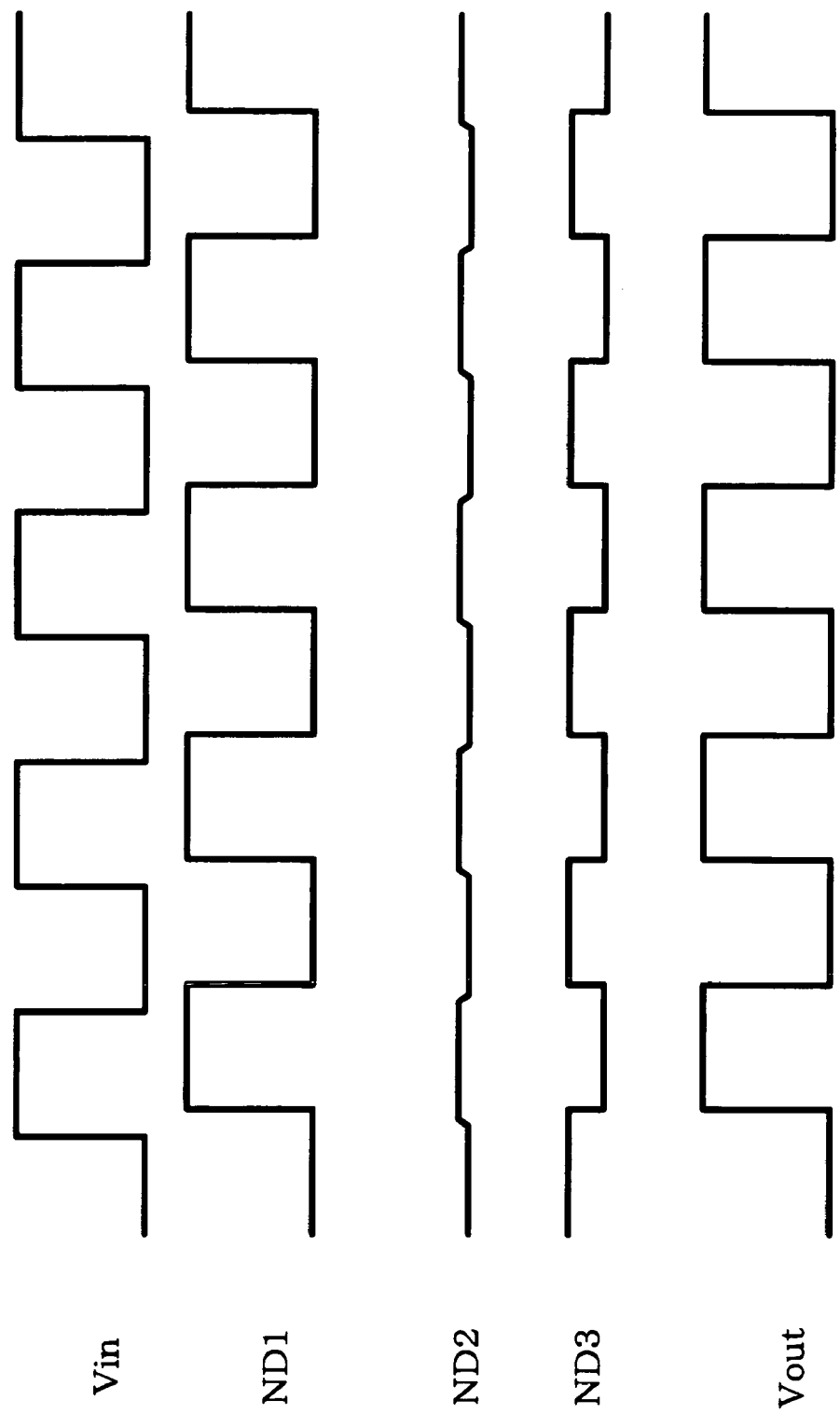
FIG. 5 is a timing diagram of an operation example of the receiver circuit shown in FIG. 4.

FIG. 5 is a timing diagram of an operation example of the receiver circuit 100 shown in FIG. 4.

FIG. 5 shows changes in the input voltage Vin, the voltage of a node ND1 which is the output of the inverter INV2 of the transmitter circuit 200, the voltage of a node ND2 which is the input end of the receiver circuit 100, the voltage of a node ND3 which is the gate of the transistor QR1, and the output voltage Vout.

When the input voltage Vin has changed to the high-potential-side power supply voltage corresponding to the logic level "H", the voltage of the node ND1 also changes to the high-potential-side power supply voltage. This causes the transistor QS1 to be turned ON, whereby the current IH is drawn through the signal line 250.

The voltage of the node ND2 increases from a given transmission line reference potential in an amount corresponding to the amplitude. This causes the impedance of the transistor QR11 of the differential amplifier circuit 110 to decrease, whereby the voltage of the node ND3 decreases. Therefore, the impedance of the transistor QR1 increases, whereby the drain current of the transistor QR1 decreases and the potential of the output voltage Vout increases.

On the other hand, when the input voltage Vin has changed to the low-potential-side power supply voltage corresponding to the logic level "L", the voltage of the node ND1 also changes to the low-potential-side power supply voltage. This causes the transistor QS2 to be turned ON, whereby the current IL is drawn through the signal line 250.

The voltage of the node ND2 decreases from a given transmission line reference potential in an amount corresponding to the amplitude. This causes the impedance of the transistor QR11 of the differential amplifier circuit 110 to increase, whereby the voltage of the node ND3 increases. Therefore, the impedance of the transistor QR1 decreases, whereby the drain current of the transistor QR1 increases and the potential of the output voltage Vout decreases.

1.4 SECOND CONFIGURATION EXAMPLE

In the bias voltage generation circuit 130 in the first configuration example shown in FIG. 4, the transistors QR20 and QR21 are provided to generate the bias voltage Vb. Note that the invention is not limited thereto.

Figure 6:
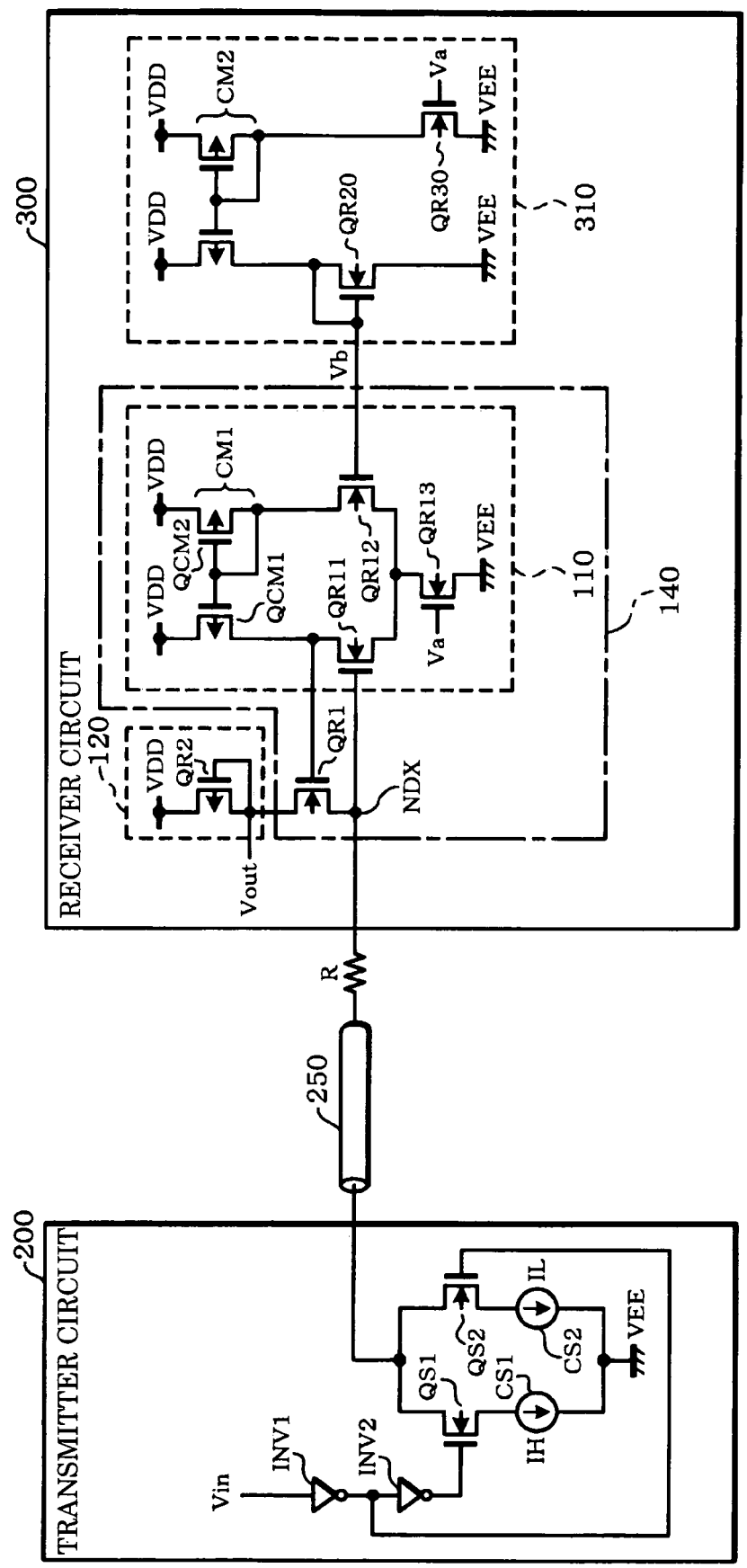
FIG. 6 is a circuit diagram of a second configuration example of the receiver circuit shown in FIG. 2.

FIG. 6 is a circuit diagram of a second configuration example of the receiver circuit shown in FIG. 2. In FIG. 6, the same sections as shown in FIG. 4 are indicated by the same symbols. Description of these sections is appropriately omitted.

A receiver circuit 300 in the second configuration example differs from the receiver circuit 100 in the first configuration example in that a transistor corresponding to the transistor QR21 of the bias voltage generation circuit 130 is not provided in a bias voltage generation circuit 310. This configuration also allows the potential of the bias voltage Vb to be changed corresponding to the current drive capability of the transistor QR12 in the same manner as in the first configuration example, whereby the drain current of the transistor QR11 which makes up the differential pair also changes. As a result, the drain voltage of the transistor QR11 can be changed. Therefore, it is unnecessary to provide a large margin potential Vm for the bias voltage Vb in order to operate the differential amplifier circuit 110 at high speed.

However, since the bias voltage Vb cannot be accurately changed in comparison with the first configuration example, it is necessary to provide the margin potential Vm larger than that of the first configuration example, although the margin potential Vm is smaller than that when fixing the bias voltage Vb. Note that the second configuration example can simplify the configuration of the bias voltage generation circuit in comparison with the first configuration example.

1.5 THIRD CONFIGURATION EXAMPLE

In order to reduce the margin potential Vm, it is necessary to accurately generate the bias voltage Vb corresponding to the manufacturing variation of the transistor of the differential amplifier circuit 110. In the first and second configuration examples, the load provided in the differential amplifier circuit 110 differs from the load provided in the bias voltage generation circuit. Therefore, the bias voltage Vb is accurately generated as much as possible by making the current drive capability ratio of the transistors of the bias voltage generation circuit equal to the current drive capability ratio of the transistors of the differential amplifier circuit 110.

In a third configuration example, the bias voltage generation circuit more accurately generates the bias voltage Vb by providing load corresponding to that of the differential amplifier circuit 110 in the bias voltage generation circuit.

Figure 7:
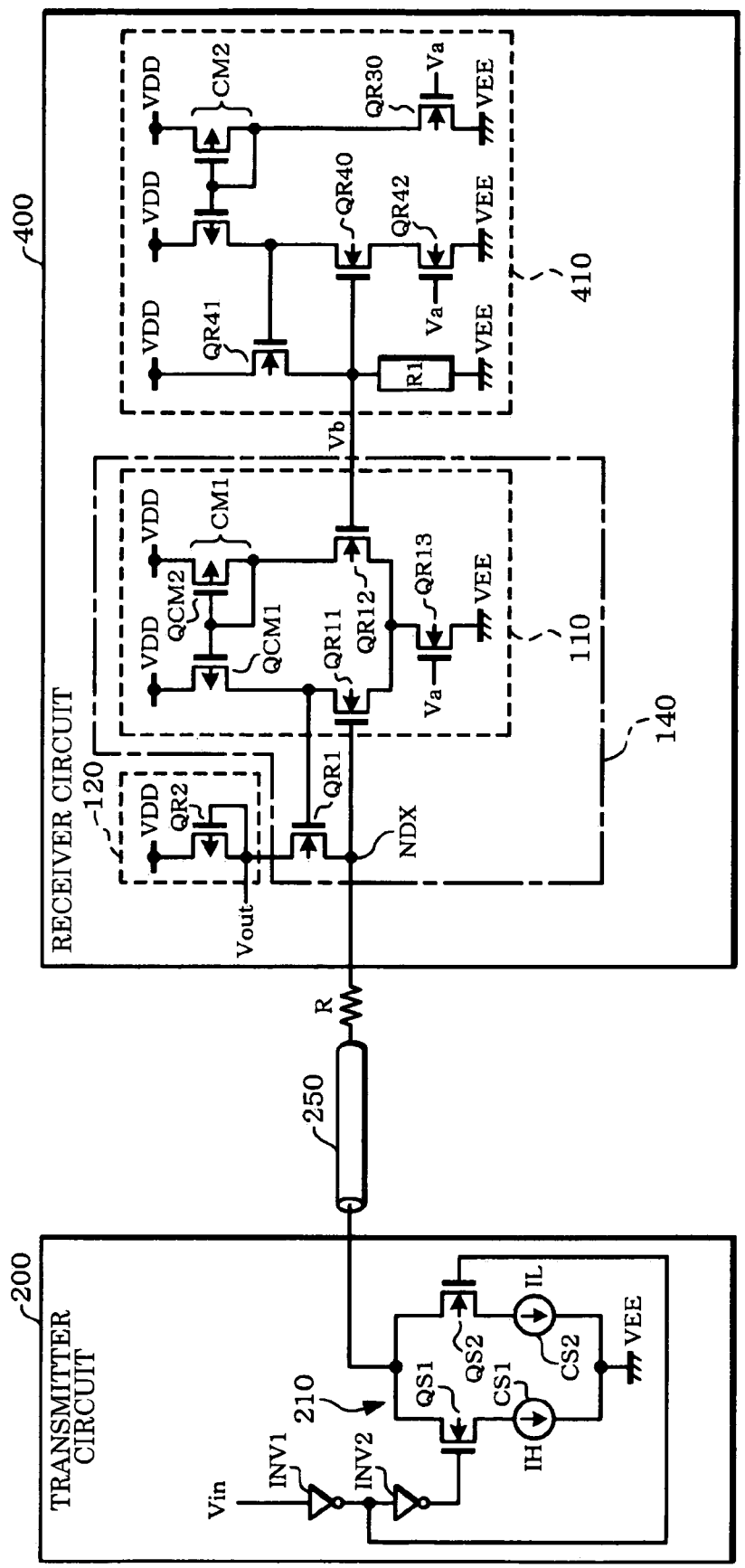
FIG. 7 is a circuit diagram of a third configuration example of the receiver circuit shown in FIG. 2.

FIG. 7 is a circuit diagram of the third configuration example of the receiver circuit shown in FIG. 2. In FIG. 7, the same sections as shown in FIG. 4 are indicated by the same symbols. Description of these sections is appropriately omitted.

A receiver circuit 400 in the third configuration example differs from the receiver circuit 100 as to the first configuration example in the configuration of a bias voltage generation circuit 410.

The bias voltage generation circuit 410 includes N-type MOS transistors QR40, QR41, and QR42, and a load circuit R1. The transistor QR40 (third bias voltage generation transistor) is of the same conductivity type (N-type) as that of the transistor QR12 (second differential transistor). The gate of the transistor QR12 is connected with the gate of the transistor QR40. The gate voltage of the transistor QR40 (third bias generation voltage transistor) is supplied to the source of the transistor QR41, and the drain voltage of the transistor QR40 is supplied to the gate of the transistor QR41. The gate voltage of the transistor QR13 (second current adjustment transistor) is supplied to the gate of the transistor QR42 (fourth current adjustment transistor). That is, the transistor QR42 adjusts the drain current of the transistor QR40 (third bias voltage generation transistor). The load circuit R1 is connected with the source of the transistor QR41.

Specifically, the transistor QR40 has the function of the transistor QR20 in the first configuration example. The transistor QR41 functions as the load of the transistor QR1 of the current/voltage conversion circuit 120. The transistor QR42 generates a current in an amount the same as that of the transistor QR13 of the differential amplifier circuit 110. The load circuit R1 has the function of causing the drain current of the transistor QR41 to flow into the power supply line to which the low-potential-side power supply voltage VEE is supplied.

It is preferable that the current drive capability of the transistor QR41 be set to be equal to the current drive capability of the transistor QR1 (first current adjustment transistor). This allows load which changes corresponding to the manufacturing variation similar to that of the transistor QR11 to be provided to the gate of the transistor QR12. Therefore, the bias voltage Vb can be accurately adjusted corresponding to the manufacturing variation of the transistor of the differential amplifier circuit 110.

When the sum of the current drive capabilities of the transistor QR11 and QR12 is indicated by DD, the current drive capability of the transistor QR13 is indicated by ID, the current drive capability of the transistor QR40 is indicated by BD11, and the current drive capability of the transistor QR42 is indicated by BD12, it is preferable that "DD/ID" be equal to "BD11/BD12".

This allows the change in the current drive capability of the transistors QR11, QR12, and QR13 of the differential amplifier circuit 110 due to manufacturing variation to correspond to the change in the current drive capability of the transistors QR40 and QR41 of the bias voltage generation circuit 410 due to manufacturing variation. Therefore, the potential of the bias voltage Vb can be accurately adjusted corresponding to the current drive capability of the transistor QR12.

2. Differential Signal Interface Circuit

FIGS. 1 to 7 illustrate an example of the single-ended signal interface circuit and receiver circuit. Note that this embodiment may also be applied to a differential signal interface circuit and a differential signal receiver circuit.

2.1. Interface Circuit

Figure 8:
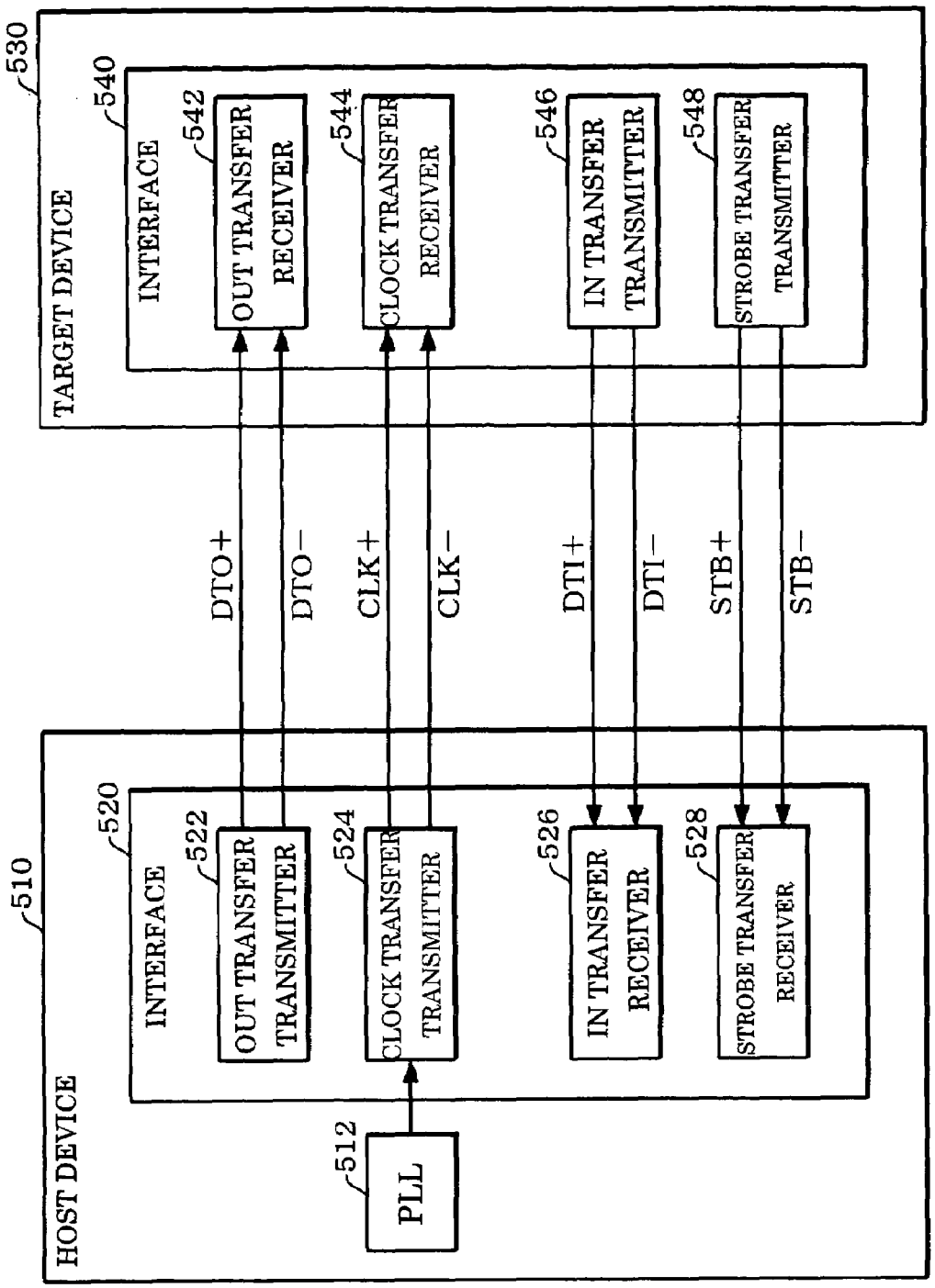
FIG. 8 is a diagram showing an outline of a configuration of a differential signal interface circuit according to one embodiment of the invention.

FIG. 8 shows an outline of a configuration of a differential signal interface circuit according to this embodiment. In FIG. 8, a host device 510 supplies a clock signal, and a target device 530 operates using the supplied clock signal as a system clock signal.

In FIG. 8, DTO+ and DTO− indicate data (OUT data) output from the host device 510 (device in a broad sense) to the target device 530 (device in a broad sense). CLK+ and CLK− indicate clock signals supplied from the host device 510 to the target device 530. The host device 510 outputs the data DTO+/− in synchronization with the edge (rising edge or falling edge) of the clock signals CLK+/−. Therefore, the target device 530 can sample and capture the data DTO+/− using the clock signals CLK+/−. In FIG. 8, the target device 530 operates based on the clock signals CLK+/− supplied from the host device 510. Specifically, the clock signals CLK+/− serve as the system clock signals of the target device 530. Therefore, a phase locked loop (PLL) circuit 512 (clock signal generation circuit in a broad sense) is provided in the host device 510, and is not provided in the target device 530.

DTI+ and DTI− indicate data (IN data) output from the target device 530 to the host device 510. STB+ and STB− indicate strobes (clock signals in a broad sense) supplied from the target device 530 to the host device 510. The target device 530 generates and outputs the strobes STB+/− based on the clock signals CLK+/− supplied from the host device 510. The target device 530 outputs the data DTI+/− in synchronization with the edge (rising edge or falling edge) of the strobes STB+/−. Therefore, the host device 510 can sample and capture the data DTI+/− using the strobes STB+ and STB−.

The data DTO+/−, the clock signals CLK+/−, the data DTI+/−, and the strobes STB+/− are transmitted by causing the transmitter circuits (driver circuits) to current-drive the corresponding differential signal lines (serial signal lines in a broad sense). In order to realize a higher speed transfer, two or more pairs of DTO+/− differential signal lines and DTI+/− differential signal lines may be provided.

An interface circuit 520 of the host device 510 includes OUT transfer (data transfer in a broad sense) and clock transfer transmitter circuits 522 and 524, and IN transfer (data transfer in a broad sense) and strobe transfer (clock transfer in a broad sense) receiver circuits 526 and 528 (differential signal receiver circuits in a broad sense). An interface circuit 540 of the target device 530 includes OUT transfer and clock transfer receiver circuits 542 and 544, and IN transfer and strobe transfer transmitter circuits 546 and 548 (differential signal transmitter circuit in a broad sense). Note that some of these circuit blocks may be omitted.

The OUT transfer and clock transfer transmitter circuits 522 and 524 respectively transmit the data DTO+/− and the clock signals CLK+/− by current-driving the DTO+/− differential signal lines and the CLK+/− differential signal lines. The OUT transfer and clock transfer receiver circuits 542 and 544 respectively receive the data DTO+/− and the clock signal CLK+/− by performing a current/voltage conversion based on current flowing through the DTO+/− differential signal lines and the CLK+/− differential signal lines, and comparing (differential amplification) the differential voltages obtained by current/voltage conversion.

The IN transfer and clock transfer transmitter circuits 546 and 548 respectively transmit the data DTI+/− and the strobes STB+/− by current-driving the DTI+/− differential signal lines and the STB+/− differential signal lines. The IN transfer and clock transfer receiver circuits 546 and 548 respectively receive the data DTI+/− and the strobes STB+/− by performing a current/voltage conversion based on current flowing through the DTI+/− differential signal lines and the STB+/− differential signal lines, and comparing (differential amplification) the differential voltages obtained by current/voltage conversion.

As described above, the interface circuit may include a differential signal receiver circuit which is connected through a first signal line making up a differential signal line with a differential signal transmitter circuit of a partner device which current-drives the first signal line, and a differential signal transmitter circuit which is connected with a differential signal receiver circuit of the partner device through a second signal line making up the differential signal line and current-drives the second signal line. The interface circuits 520 and 530 shown in FIG. 8 respectively include two transmitter circuits and two receiver circuits.

2.2 Differential Signal Receiver Circuit

Figure 9:
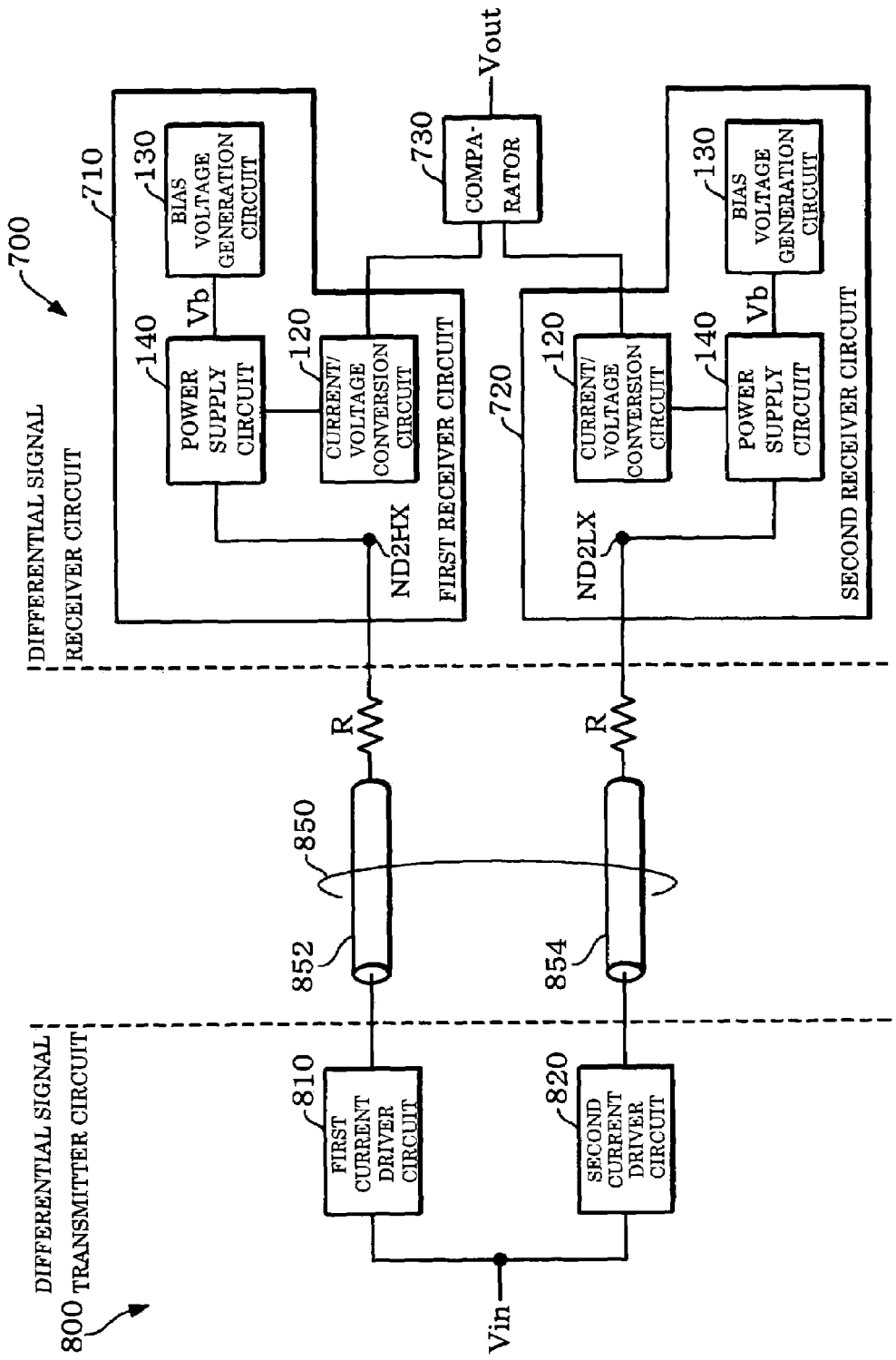
FIG. 9 is a diagram showing an outline of a configuration of a differential signal receiver circuit according to one embodiment of the invention.

FIG. 9 shows an outline of a configuration of the differential signal receiver circuit according to this embodiment. In FIG. 9, the same sections as shown in FIG. 4 are indicated by the same symbols. Description of these sections is appropriately omitted.

The differential signal receiver circuit shown in FIG. 9 may be used as the IN transfer receiver circuit 526, the strobe transfer receiver circuit 528, the OUT transfer receiver circuit 542, and the clock transfer receiver circuit 544 shown in FIG. 8.

A differential signal transmitter circuit 800 (transmitter circuit in a broad sense) is connected with a differential signal receiver circuit 700 through a differential signal line 850 which is a differential signal transmission line. The differential signal transmitter circuit 800 includes first and second current driver circuits 810 and 820. Each of the first and second current driver circuits 810 and 820 current-drives the differential signal line 850 based on the input voltage Vin corresponding to transmission data. The differential signal transmitter circuit 800 transmits differential signals through the differential signal line 850. The differential signal transmitter circuit 800 may be used as the OUT transfer transmitter circuit 522, the clock transfer transmitter circuit 524, the IN transfer transmitter circuit 546, and the strobe transfer transmitter circuit 548 shown in FIG. 8.

The differential signal receiver circuit 700 is connected with first and second signal lines 852 and 854 making up the differential signal line 850 which is current-driven by the differential signal transmitter circuit 800. The differential signal receiver circuit 700 includes a first receiver circuit 710 connected with the first signal line 852, a second receiver circuit 720 connected with the second signal line 854, and a comparator 730. At least one of the first and second receiver circuits 710 and 720 has the same configuration as that of the receiver circuit 100 shown in FIG. 4.

The comparator 730 outputs the output voltage Vout (output signal in a broad sense) based on the outputs from the first and second receiver circuits 710 and 720. In more detail, the comparator 730 compares the voltage converted by the current/voltage conversion circuit 120 of the first receiver circuit 710 with the voltage converted by the current/voltage conversion circuit 120 of the second receiver circuit 720 to output the output signal.

The configurations of the first and second receiver circuits 710 and 720 are the same as that of the receiver circuit 100 shown in FIG. 2. Therefore, description thereof is omitted.

2.3 FIRST CONFIGURATION EXAMPLE

Figure 10:
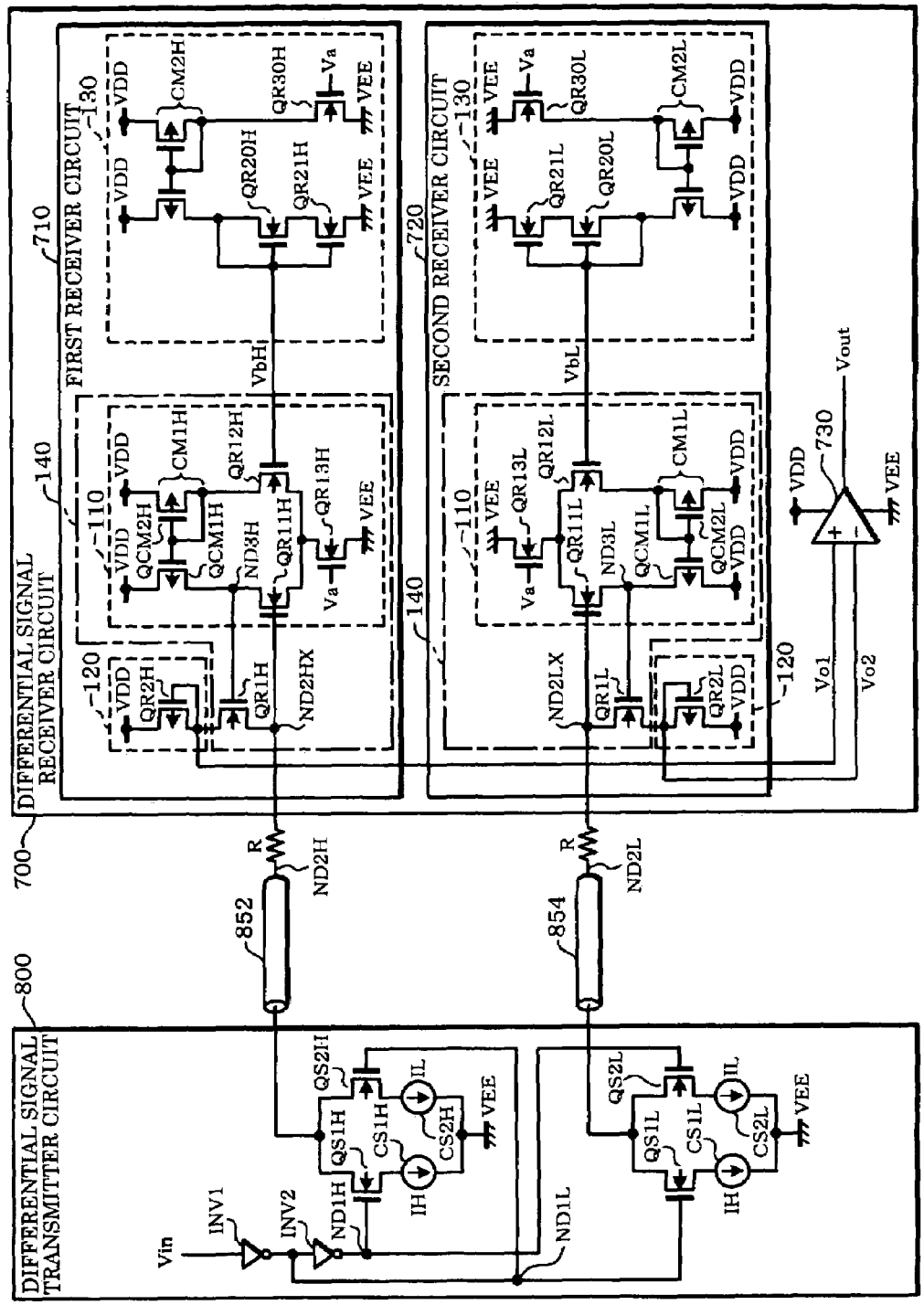
FIG. 10 is a circuit diagram of a first configuration example of the differential signal receiver circuit shown in FIG. 9.

FIG. 10 is a circuit diagram of a first configuration example of the differential signal receiver circuit.

In FIG. 10, the same sections as shown in FIG. 9 are indicated by the same symbols. Description of these sections is appropriately omitted. In FIG. 10, the same sections as shown in FIG. 4 are indicated by the same symbols. In addition, in order to distinguish the first and second receiver circuits 710 and 720, the symbols are provided with "H" (first receiver circuit 710) or "L" (second receiver circuit 720) on the end.

The differential signal transmitter circuit 800 includes N-type MOS transistors (MOS transistor is hereinafter abbreviated as "transistor") QS1H, QS2H, QS1L, and QS2L. The drains of the transistors QS1H and QS2H are connected with the first signal line 852. The drains of the transistors QS1L and QS2L are connected with the second signal line 854. The input voltage Vin is buffered by inverters INV1 and INV2. The output voltage of the inverter INV2 is supplied to the gates of the transistors QS1H and QS2L. The output voltage of the inverter INV1 is supplied to the gates of the transistors QS2H and QS1L.

Current sources CS1H and CS1L for causing a current IH to flow are respectively provided to the sources of the transistors QS1H and QS1L. The current sources CS1H and CS1L may be formed by N-type MOS transistors of which the drain is connected with the source of the transistor QS1H or QS1L and to which the low-potential-side power supply voltage VEE is supplied at the source.

Current sources CS2H and CS2L for causing a current IL smaller than the current IH to flow are respectively provided to the sources of the transistors QS2H and QS2L. The current sources CS2H and CS2L may be formed by N-type MOS transistors of which the drain is connected with the source of the transistor QS2H or QS2L and to which the low-potential-side power supply voltage VEE is supplied at the source.

Therefore, the transistors QS1H and QS2L are turned ON and the transistors QS2H and QS1L are turned OFF when the input voltage Vin is set at a high-potential-side power supply voltage corresponding to the logic level "H", whereby the differential signal transmitter circuit 800 draws the current IH through the first signal line 852 and draws the current IL through the second signal line 854. The transistors QS1H and QS2L are turned OFF and the transistors QS2H and QS1L are turned ON when the input voltage Vin is set at a low-potential-side power supply voltage corresponding to the logic level "L", whereby the differential signal transmitter circuit 800 draws the current IL through the first signal line 852 and draws the current IH through the second signal line 854.

In the differential signal receiver circuit 700, the first receiver circuit 710 detects a change in potential corresponding to the amount of current which is driven through the first signal line 852 as described above with respect to a bias voltage VbH, and outputs the result as an output voltage Vo1. The first receiver circuit 720 detects a change in potential corresponding to the amount of current which is driven through the second signal line 854 as described above with respect to a bias voltage VbL, and outputs the result as an output voltage Vo2. The comparator 730 compares the output voltages Vo1 and Vo2 and outputs the result as the output voltage Vout.

In FIG. 10, the low-potential-side power supply voltage of the comparator 730 is set at the voltage VEE, and the high-potential-side power supply voltage is set at the voltage VDD. When the high-potential-side power supply voltage is set at a voltage other than the voltage VDD, a level shifter which converts the levels of the output voltages Vo1 and Vo2 may be provided.

Figure 11:
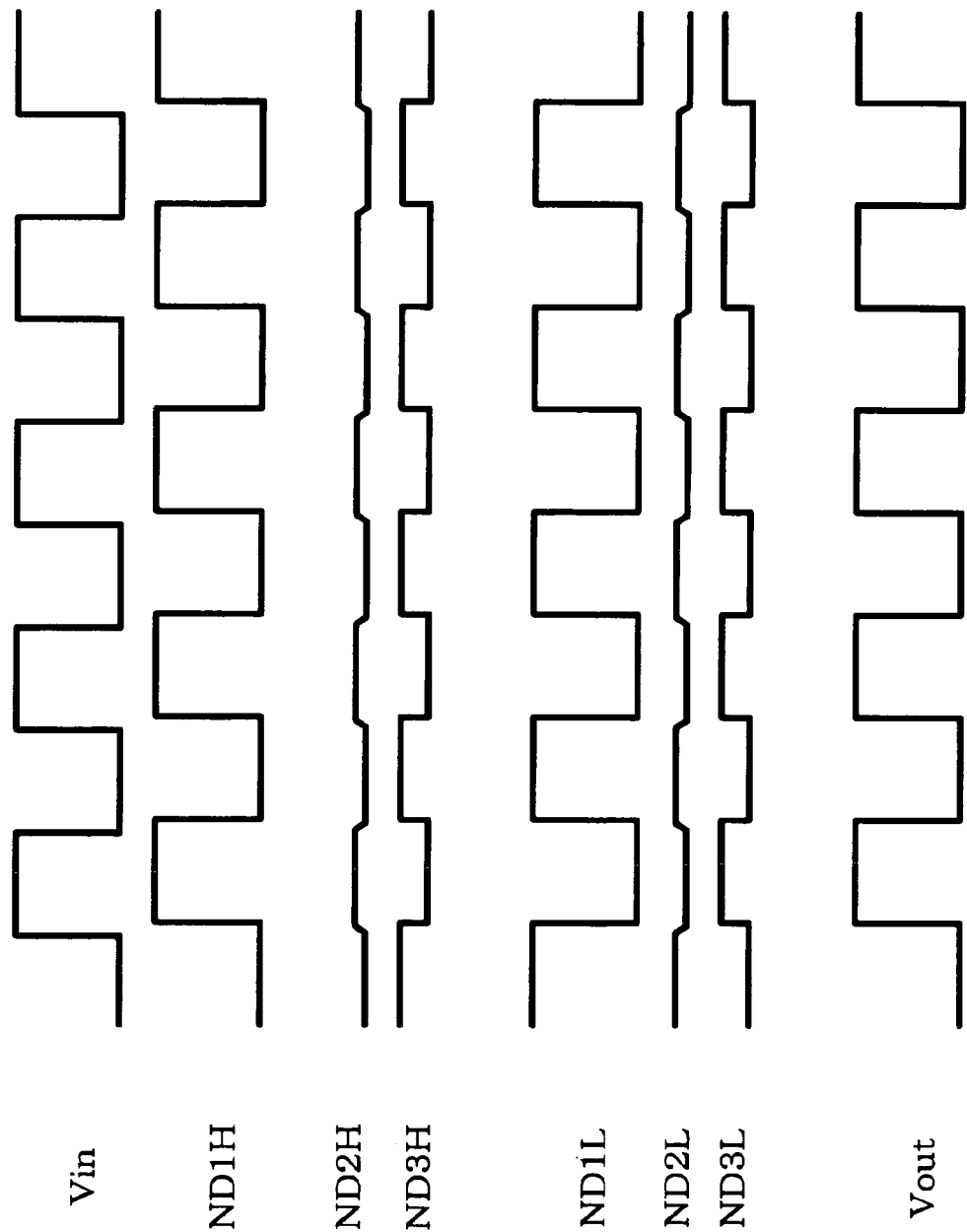
FIG. 11 is a timing diagram of an operation example of the differential signal receiver circuit shown in FIG. 10.

FIG. 11 is a timing diagram of an operation example of the differential signal receiver circuit 700 shown in FIG. 10.

Each node shown in FIG. 11 corresponds to each node shown in FIG. 5. Therefore, detailed description of each node is omitted.

According to the differential signal receiver circuit 700 in the first configuration example, even if the current drive capabilities of the constituent elements of the differential amplifier circuits 110 of the first and second receiver circuits 710 and 720 have changed due to manufacturing variation or the like, the bias voltages VbH and VbL corresponding to the changes can be generated. Therefore, the differential amplifier circuit 110 can be operated without providing an unnecessary margin potential Vm in the same manner as in the single-ended signal receiver circuit, whereby a signal at a lower potential within the transmission line potential range VR can be detected while maintaining the high-speed operability of the differential amplifier circuit 110.

2.4 SECOND CONFIGURATION EXAMPLE

In a differential signal receiver circuit 900 in a second configuration example, the receiver circuit 300 shown in FIG. 6 is applied as first and second receiver circuits 910 and 920.

Figure 12:
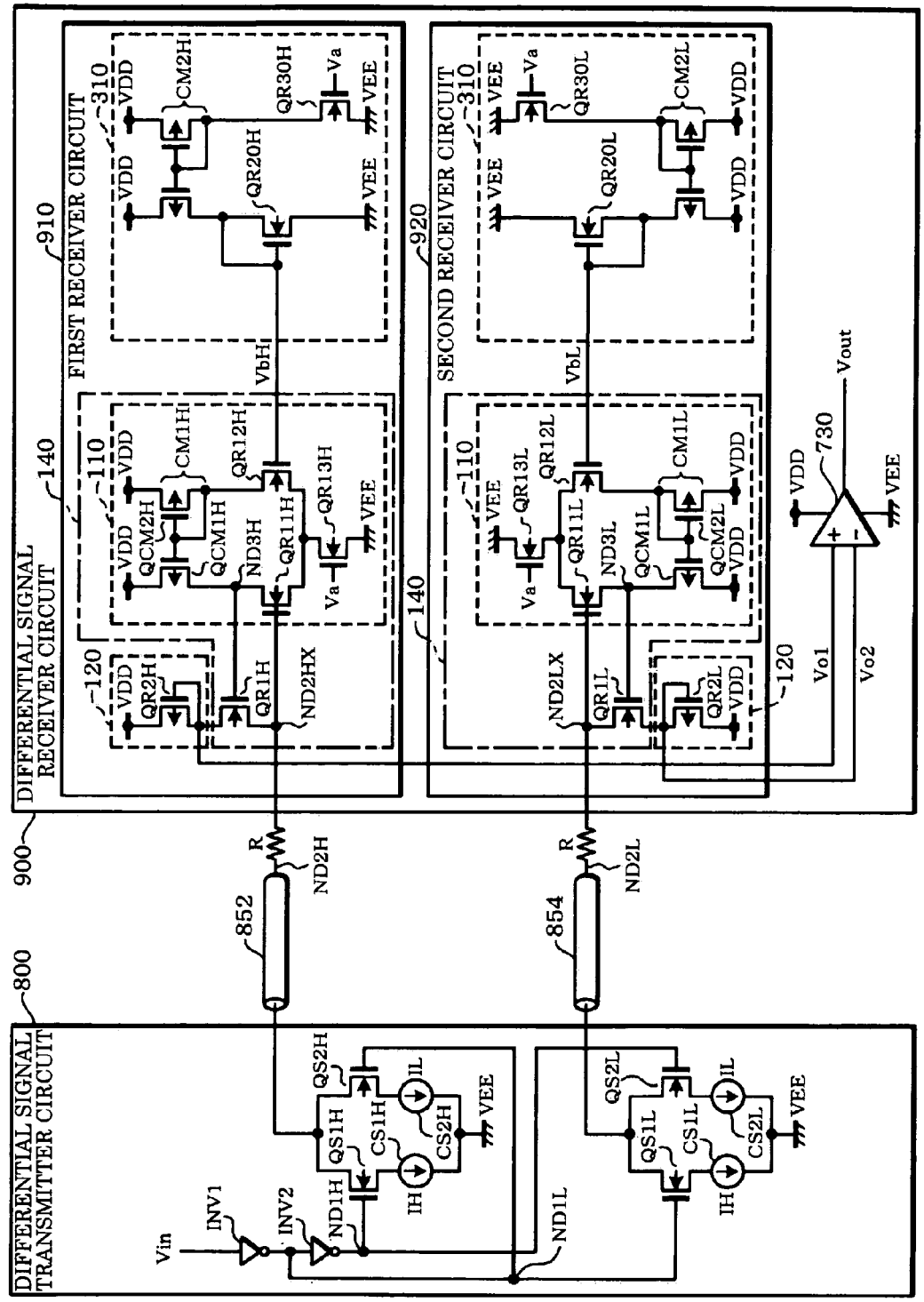
FIG. 12 is a circuit diagram of a second configuration example of the differential signal receiver circuit shown in FIG. 9.

FIG. 12 is a circuit diagram of the second configuration example of the differential signal receiver circuit shown in FIG. 9.

In FIG. 12, the same sections as shown in FIG. 6 or 9 are indicated by the same symbols. Description of these sections is appropriately omitted.

As shown in FIG. 12, the differential signals can be detected by applying the receiver circuit 300 shown in FIG. 6. Therefore, the differential signal receiver circuit 900 in the second configuration example also allows the differential amplifier circuit 110 to be operated without providing an unnecessary margin potential Vm, whereby a signal at a lower potential within the transmission line potential range VR can be detected while maintaining the high-speed operability of the differential amplifier circuit 110. Although the second configuration example cannot accurately generate the bias voltage in comparison with the first configuration example, the second configuration example can reduce the number of transistors.

2.5 THIRD CONFIGURATION EXAMPLE

In a differential signal receiver circuit 1000 in a third configuration example, the receiver circuit 400 shown in FIG. 7 is applied as first and second receiver circuits 1010 and 1020.

Figure 13:
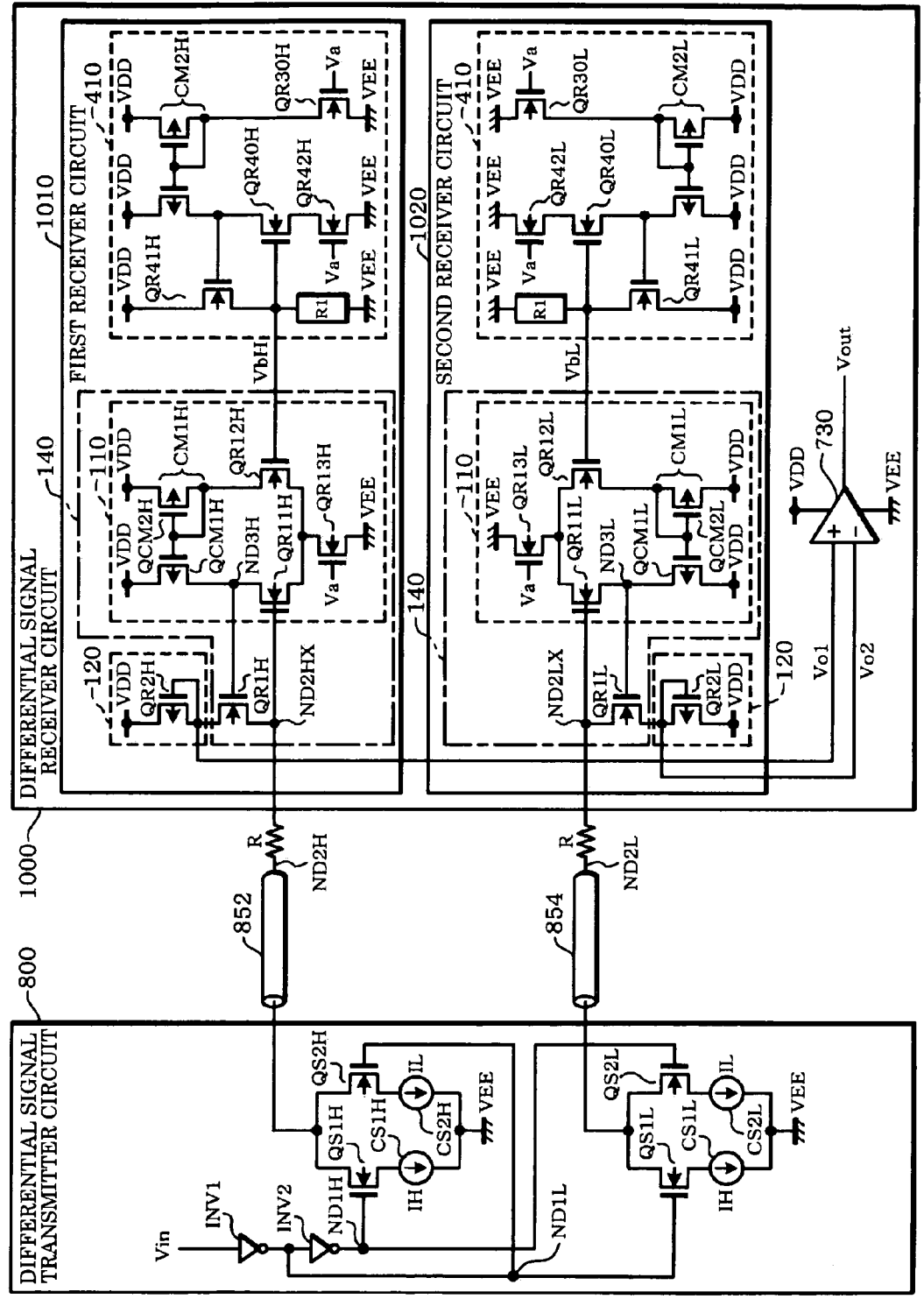
FIG. 13 is a circuit diagram of a third configuration example of the differential signal receiver circuit shown in FIG. 9.

FIG. 13 is a circuit diagram of the third configuration example of the differential signal receiver circuit shown in FIG. 9.

In FIG. 13, the same sections as shown in FIG. 7 or 9 are indicated by the same symbols. Description of these sections is appropriately omitted.

As shown in FIG. 13, the differential signals can be detected by applying the receiver circuit 400 shown in FIG. 7. Therefore, the differential signal receiver circuit 1000 in the third configuration example also allows the differential amplifier circuit 110 to be operated without providing an unnecessary margin potential Vm, whereby a signal at a lower potential within the transmission line potential range VR can be detected while maintaining the high-speed operability of the differential amplifier circuit 110. Moreover, the manufacturing variation of the transistors QR11H, QR12H, and QR13H of the differential amplifier circuit 110 is allowed to be equal to the manufacturing variation of the transistors QR40H and QR42H of the bias voltage generation circuit 410. The manufacturing variation of the transistors QR11L, QR12L, and QR13L of the differential amplifier circuit 110 is also allowed to be equal to the manufacturing variation of the transistors QR40L and QR42L of the bias voltage generation circuit 410. Therefore, the potentials of the bias voltages VbH and VbL can be accurately changed corresponding to the current drive capabilities of the transistors QR12H and QR12L.

3. Electronic Instrument

Figure 14:
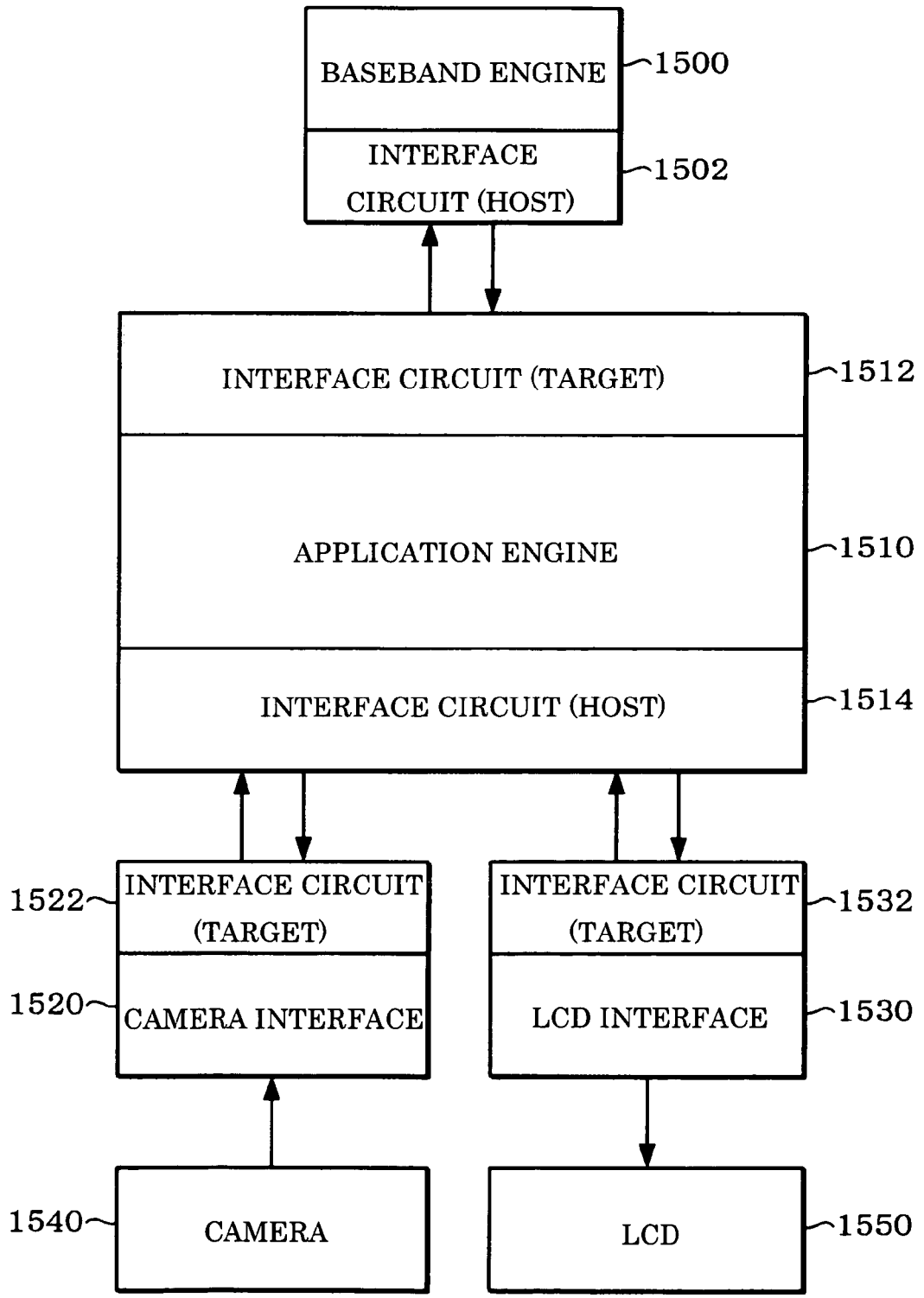
FIG. 14 is a block diagram of a configuration example of an electronic instrument according to one embodiment of the invention.

FIG. 14 shows a configuration example of an electronic instrument according to one embodiment of the invention. The electronic instrument includes interface circuits 1502, 1512, 1514, 1522, and 1532 described in the above embodiment. The electronic instrument includes a baseband engine 1500 (communication device in a broad sense), an application engine (processor in a broad sense), a camera 1540 (imaging device in a broad sense), and a liquid crystal display (LCD) 1550 (display device in a broad sense). Note that the electronic instrument may have a configuration in which some of these blocks are omitted. The configuration shown in FIG. 14 realizes a portable telephone having a camera function and an LCD display function. Note that the electronic instrument according to this embodiment is not limited to a portable telephone, and may also be applied to various electronic instruments such as a digital camera, PDA, electronic notebook, electronic dictionary, or portable information terminal.

As shown in FIG. 14, the data transfer described with reference to FIG. 1 or 8 is performed between the host-side interface circuit 1502 provided to the baseband engine 1500 and the target-side interface circuit 1512 provided to the application engine 1510 (graphic engine). The data transfer described with reference to FIG. 1 or 8 is also performed between the host-side interface circuit 1514 provided to the application engine 1510 and the target-side interface circuits 1522 and 1532 respectively provided to the camera interface 1520 and the LCD interface 1530.

A portable information instrument such as a portable telephone includes a first instrument section provided with buttons (character panel) for inputting a telephone number or characters, a second instrument section provided with a main liquid crystal display (LCD), a sub LCD, or a camera (one or more devices), and a connection section (e.g. hinge) which connects the first and second instrument sections. The baseband engine 1500, the application engine 1510, and the interface circuits (data transfer control devices) 1502, 1512, and 1514 shown in FIG. 14 may be provided in the first instrument section. The interface circuits 1522 and 1532, the camera interface 1520, the LCD interface 1530, the camera 1540, and the LCD 1550 may be provided in the second instrument section. In a known method, data is transferred between the first instrument section (first substrate) and the second instrument section (second substrate) using a parallel bus (system bus).

On the other hand, this embodiment allows data to be transferred between the first instrument section and the second instrument section using signal lines or differential signal lines of a serial bus. Therefore, the number of interconnects passing through the connection section which connects the first and second instrument sections can be significantly reduced, whereby the design of the connection section and mounting can be facilitated. Moreover, EMI noise can be reduced.

The invention is not limited to the above-described embodiments. Various modifications and variations may be made within the spirit and scope of the invention.

The interface circuit to which the receiver circuit or the transmitter circuit according to the above embodiment is applied is not limited to the interface circuit described with reference to FIG. 1 or 8. The specific configurations of the receiver circuit and the transmitter circuit are not limited to those described in the above embodiment.

Some of the requirements of any claim of the invention may be omitted from a dependent claim which depends on that claim. Moreover, some of the requirements of any independent claim of the invention may be allowed to depend on any other independent claim.

Although only some embodiments of the invention are described in detail above, those skilled in the art would readily appreciate that many modifications are possible in the embodiments without materially departing from the novel teachings and advantages of the invention. Accordingly, such modifications are intended to be included within the scope of the invention.

What is claimed is:

1. A receiver circuit which is connected with a partner transmitter circuit through a signal line and receives a signal based on a current which flows through the signal line, the receiver circuit comprising:
   a current/voltage conversion circuit which converts the current which flows through the signal line into a voltage;
   a power supply circuit which adjusts the current which flows through the signal line based on a bias voltage and a voltage of a node connected with the signal line; and
   a bias voltage generation circuit which outputs the bias voltage,
   the power supply circuit includes
   a first current adjustment transistor connected with the node and the current/voltage conversion circuit, and
   a first differential transistor and a second differential transistor which make up a differential pair and of which drain currents are controlled,
   a gate of the first differential transistor is connected with the node, and a drain of the first differential transistor is connected with a gate of the first current adjustment transistor,
   the bias voltage is supplied to a gate of the second differential transistor, and
   the bias voltage generation circuit generates the bias voltage corresponding to the drain current of the first differential transistor or the second differential transistor.

2. The receiver circuit as defined in claim 1,
   the bias voltage generation circuit includes a bias voltage generation transistor of the same conductivity type as that of the second differential transistor; and
   a gate and a drain of the bias voltage generation transistor are connected with the gate of the second differential transistor.

3. The receiver circuit as defined in claim 2,
   the bias voltage generation transistor is formed on the same substrate as the first differential transistor and the second differential transistor, and
   a drain current of the bias voltage generation transistor is adjusted corresponding to the drain currents of the first differential transistor and the second differential transistor.

4. The receiver circuit as defined in claim 2,
   the power supply circuit includes a second current adjustment transistor which adjusts a sum of the drain currents of the first differential transistor and the second differential transistor,
   the bias voltage generation circuit includes a third current adjustment transistor for generating a current proportional to a drain current of the bias voltage generation transistor, and
   a voltage equal to a gate voltage of the second current adjustment transistor is supplied to a gate of the third current adjustment transistor.

5. The receiver circuit as defined in claim 3,
   the power supply circuit includes a second current adjustment transistor which adjusts a sum of the drain currents of the first differential transistor and the second differential transistor,
   the bias voltage generation circuit includes a third current adjustment transistor for generating a current proportional to a drain current of the bias voltage generation transistor, and
   wherein a voltage equal to a gate voltage of the second current adjustment transistor is supplied to a gate of the third current adjustment transistor.

6. The receiver circuit as defined in claim 1,
   the bias voltage generation circuit includes
   a bias voltage generation transistor of the same conductivity type as that of the second differential transistor; and
   a current adjustment transistor which adjusts a drain current of the bias generation transistor.

7. A differential signal receiver circuit comprising:
   a first receiver circuit connected with a first signal line making up a differential signal line which is current-driven by a transmitter circuit;
   a second receiver circuit connected with a second signal line making up the differential signal line; and
   a comparator which outputs an output signal based on outputs from the first receiver circuit and the second receiver circuit;
   at least one of the first receiver circuit and the second receiver circuit being the receiver circuit as defined in claim 1.

8. The differential signal receiver circuit as defined in claim 7,
   the first receiver circuit and the second receiver circuit are the receiver circuits as defined in claim 1; and
   the comparator compares a voltage converted by the current/voltage conversion circuit of the first receiver circuit with a voltage converted by the current/voltage conversion circuit of the second receiver circuit to output the output signal.

9. An interface circuit comprising:
   the differential signal receiver circuit as defined in claim 8 which is connected through a first signal line making up a differential signal line with a differential signal transmitter circuit of a partner device which current-drives the first signal line; and
   a differential signal transmitter circuit which is connected with a differential signal receiver circuit of the partner device through a second signal line making up the differential signal line and current-drives the second signal line.

10. An interface circuit comprising:
    the differential signal receiver circuit as defined in claim 7 which is connected through a first signal line making up a differential signal line with a differential signal transmitter circuit of a partner device which current-drives the first signal line; and
    a differential signal transmitter circuit which is connected with a differential signal receiver circuit of the partner device through a second signal line making up the differential signal line and current-drives the second signal line.

11. An electronic instrument comprising:
the interface circuit as defined in claim 10; and
at least one of a communication device, a processor, an imaging device, and a display device.

12. An interface circuit comprising:
the receiver circuit as defined in claim 1 which is connected through a reception signal line with a transmitter circuit of a partner device which current-drives the reception signal line; and
a transmitter circuit which is connected with a receiver circuit of the partner device through a transmission signal line and current-drives the transmission signal line.

13. An electronic instrument comprising:
the interface circuit as defined in claim 12; and
at least one of a communication device, a processor, an imaging device, and a display device.

* * * * *